United States Patent
Solomon et al.

(10) Patent No.: US 12,161,013 B2
(45) Date of Patent: Dec. 3, 2024

(54) ARTICLES INCLUDING NANOSTRUCTURED SURFACES AND ENCLOSED VOIDS, AND METHODS OF MAKING SAME

(71) Applicant: 3M INNOVATIVE PROPERTIES COMPANY, St. Paul, MN (US)

(72) Inventors: Jeffrey L. Solomon, Centerville, MN (US); Henrik B. van Lengerich, St. Paul, MN (US); Bryan V. Hunt, Nowthen, MN (US); Tabitha A Silliman, Woodbury, MN (US); William Blake Kolb, Stillwater, MN (US); Nicholas C. Erickson, St. Paul, MN (US); Stephen M. Menke, St. Paul, MN (US); Derek W. Patzman, Prior Lake, MN (US); Justin P Meyer, Oakdale, MN (US); Bert T. Chien, St. Paul, MN (US); Thomas E. Muehle, Woodbury, MN (US); Thomas P. Klun, Lakeland, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 323 days.

(21) Appl. No.: 17/631,522

(22) PCT Filed: Sep. 16, 2020

(86) PCT No.: PCT/IB2020/058611
§ 371 (c)(1),
(2) Date: Jan. 31, 2022

(87) PCT Pub. No.: WO2021/053534
PCT Pub. Date: Mar. 25, 2021

(65) Prior Publication Data
US 2022/0271261 A1 Aug. 25, 2022

Related U.S. Application Data

(60) Provisional application No. 62/901,863, filed on Sep. 18, 2019, provisional application No. 63/071,488, filed on Aug. 28, 2020.

(51) Int. Cl.
*H10K 50/858* (2023.01)
*G02B 1/04* (2006.01)
(Continued)

(52) U.S. Cl.
CPC ............ *H10K 50/858* (2023.02); *G02B 1/04* (2013.01); *H10K 71/00* (2023.02); *H10K 71/50* (2023.02);
(Continued)

(58) Field of Classification Search
None
See application file for complete search history.

(56) References Cited

U.S. PATENT DOCUMENTS 4,847,137 A 7/1989 Kellen
6,005,137 A 12/1999 Moore
(Continued)

FOREIGN PATENT DOCUMENTS

CN 108431644 A 8/2018
JP 2016518117 A * 6/2016
(Continued)

OTHER PUBLICATIONS

Burzynski, "Large Optical Birefringence In Poly(p-phenylene vinylene) Films Measured By Optical Waveguide Techniques", Polymer, 1990, vol. 31, pp. 627-630.
(Continued)

Primary Examiner — Michael Lebentritt
(74) Attorney, Agent, or Firm — Thomas M. Spielbauer; Adrian L. Pishko

(57) ABSTRACT

The present disclosure provides an article including a layer having a nanostructured first surface including nanofeatures
(Continued)

and an opposing second surface, and an organic layer including a major surface attached to a portion of the nanofeatures. The nanostructured first surface includes protruding features that are formed of a single composition and/or recessed features. The nanofeatures and the major surface of the second layer together define at least one void. The present disclosure also provides a method of making the article including contacting nanofeatures of a layer having a nanostructured surface with a major surface of an organic layer and reacting at least one material to secure the two layers together. In addition, the present disclosure provides an optical information display and an OLED device including the article. The nanostructured surface of the article is protected from damage and contamination by the organic layer.

20 Claims, 7 Drawing Sheets

(51) Int. Cl.
  *H10K 71/00* (2023.01)
  *H10K 71/50* (2023.01)
  *H10K 102/00* (2023.01)
  *B82Y 20/00* (2011.01)
  *B82Y 30/00* (2011.01)

(52) U.S. Cl.
  CPC .............. *B82Y 20/00* (2013.01); *B82Y 30/00* (2013.01); *G02B 2207/101* (2013.01); *H10K 2102/00* (2023.02); *H10K 2102/331* (2023.02)

(56) References Cited

U.S. PATENT DOCUMENTS

| | | | |
|---|---|---|---|
| 6,329,058 | B1 | 12/2001 | Arney |
| 7,799,888 | B2 | 9/2010 | Arkles |
| 8,012,567 | B2 | 9/2011 | Gaides |
| 8,174,187 | B2 | 5/2012 | Cok |
| 8,460,568 | B2 | 6/2013 | David |
| 8,659,221 | B2 | 2/2014 | Jones |
| 9,029,586 | B2 | 5/2015 | Arkles |
| 9,138,977 | B2 | 9/2015 | Dumond |
| 9,246,134 | B2 | 1/2016 | Schwartz |
| 9,254,506 | B2 | 2/2016 | Roehrig |
| 9,464,179 | B2 | 10/2016 | Kolb |
| 9,709,704 | B2 | 7/2017 | Miyahara |
| 9,790,396 | B2 | 10/2017 | Klun |
| 9,908,837 | B2 | 3/2018 | Colby |
| 9,982,160 | B2 | 5/2018 | Klun |
| 10,011,735 | B2 | 7/2018 | Klun |
| 10,106,643 | B2 | 10/2018 | Schwartz |
| 10,942,398 | B1 * | 3/2021 | Calafiore .............. G03F 7/0002 |
| 11,312,100 | B2 | 4/2022 | Solomon |
| 2005/0179373 | A1 | 8/2005 | Kobayashi |
| 2006/0043400 | A1 | 3/2006 | Erchak |
| 2007/0236134 | A1 | 10/2007 | Ho |
| 2010/0055810 | A1 | 3/2010 | Sung |
| 2010/0126566 | A1 | 5/2010 | Ji |
| 2010/0193790 | A1 | 8/2010 | Yeo |
| 2011/0128477 | A1 | 6/2011 | Izaki |
| 2012/0038990 | A1 | 2/2012 | Hao |
| 2012/0229906 | A1 | 9/2012 | Miyahara |
| 2013/0025674 | A1 | 1/2013 | Rinko |
| 2014/0193612 | A1 | 7/2014 | Yu |
| 2014/0242343 | A1 | 8/2014 | Free |
| 2015/0203707 | A1 | 7/2015 | Klun |
| 2015/0218294 | A1 | 8/2015 | Klun |
| 2016/0318277 | A1 | 11/2016 | Schwartz |
| 2016/0368019 | A1 | 12/2016 | Wolk |
| 2017/0352839 | A1 | 12/2017 | Kim |
| 2019/0185328 | A1 | 6/2019 | Humpal |
| 2020/0017623 | A1 | 1/2020 | Ye |

FOREIGN PATENT DOCUMENTS

| | | |
|---|---|---|
| WO | WO2009-002637 | 12/2008 |
| WO | WO2017-205174 | 11/2017 |
| WO | WO2018-044565 | 3/2018 |
| WO | WO2018-045070 | 3/2018 |
| WO | WO2018-080830 | 5/2018 |
| WO | WO2018-102193 | 6/2018 |
| WO | WO2018-122749 | 7/2018 |
| WO | WC2018-204648 | 11/2018 |
| WO | WO2018-204675 | 11/2018 |
| WO | WO2019-032635 | 2/2019 |
| WO | WO2019-069214 | 4/2019 |
| WO | WO2020-044164 | 3/2020 |
| WO | WO2020-046654 | 3/2020 |
| WO | WO2020-212777 | 10/2020 |
| WO | WO-2021220096 A1 * | 11/2021 .............. G02B 1/14 |

OTHER PUBLICATIONS

Yang, "Group Contribution To Molar Refraction and Refractive Index of Conjugated Polymers", 1995, vol. 07, No. 07, pp. 1276-1285.
International Search Report for PCT International Application No. PCT/IB2020/058611, mailed on Dec. 4, 2020, 6 pages.

* cited by examiner

| $Al_2O_3$, 46 nm |
|---|
| Organic, 2 μm |
| $Al_2O_3$, 46 nm |
| CPL, 65 nm |
| Mg:Ag (10%), 8 nm |
| LiF, 1.5 nm |
| ETL, 50 nm |
| Blue Host : Blue Dopant (10%), 20 nm |
| EBL, 10 nm |
| HTL, Varied |
| ITO, 15 nm |
| Al, 100 nm |

US 12,161,013 B2

ARTICLES INCLUDING NANOSTRUCTURED SURFACES AND ENCLOSED VOIDS, AND METHODS OF MAKING SAME

TECHNICAL FIELD

The present disclosure broadly relates to articles including nanostructured surfaces and methods of making such articles.

BACKGROUND

Nanostructured surfaces can provide optical effects useful for a variety of applications such as improving the color and efficiency of devices (e.g., OLED displays). A refractive index difference or contrast is required at the nanostructured interface for the nanostructured surface to provide the desired optical functionality. The nanostructured surface can be exposed to the ambient environment to provide the refractive index contrast; however, the exposed surface limits attachment of the nanostructured surface to other surfaces and is susceptible to damage and/or contamination from the environment. Thus, there remains a need for improvements in protecting nanostructured surfaces.

SUMMARY

In a first aspect, an article is provided. The article includes a first layer including a nanostructured first surface including nanofeatures and an opposing second surface; and a second layer including a first major surface attached to a portion of the nanofeatures. The nanostructured first surface includes recessed features, or protruding features formed of a single composition, or both recessed and protruding features. The second layer is an organic layer. The nanofeatures of the first layer and the first major surface of the second layer together define at least one void.

In a second aspect, an optical information display is provided. The optical information display includes an article according to the first aspect.

In a third aspect, an OLED device is provided. The OLED device includes an article according to the first aspect.

In a fourth aspect, a method of making an article is provided. The method includes obtaining a first material including a nanostructured first surface including nanofeatures and an opposing second surface and contacting a second layer including a first major surface with a portion of the nanofeatures. The method further includes reacting at least one of the first material or the second material to secure the first layer and the second layer together. The nanostructured first surface includes recessed features, or protruding features formed of a single composition, or both recessed and protruding features. The second layer is an organic layer, and the nanofeatures of the first layer and the first major surface of the second layer together define at least one void.

Articles and methods according to at least certain embodiments of the present disclosure provide an enclosed nanostructured surface that protects the nanostructured surface and maintains the refractive index contrast of the air interface.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

Figure 1:
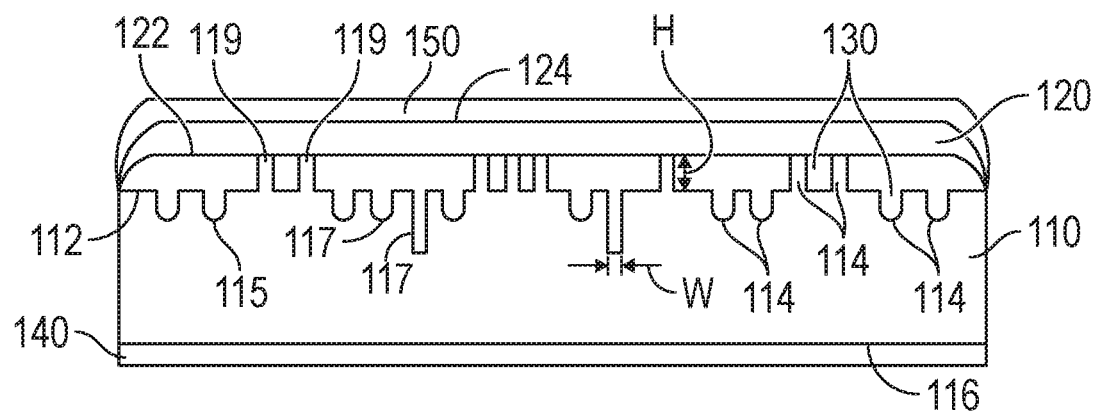
FIG. 1 is a schematic cross-sectional view of an exemplary article according to the present application.

While the above-identified figures set forth several embodiments of the disclosure, other embodiments are also contemplated, as noted in the description. The figures are not necessarily drawn to scale. In all cases, this disclosure presents the invention by way of representation and not limitation. It should be understood that numerous other modifications and embodiments can be devised by those skilled in the art, which fall within the scope and spirit of the principles of the invention.

DETAILED DESCRIPTION OF ILLUSTRATIVE EMBODIMENTS

Glossary

The term "adjacent" as used herein refers to a material or a layer that can either be in contact with another material or layer (i.e., directly adjacent), or separated from another material or layer by an intermediary material, layer, or gap.

The term "colorant" as used herein refers to a component that imparts color, including for instance, a pigment, a dye, and combinations thereof. The term "pigment" as used herein refers to a material loaded above its solubility resulting in non-dissolved (or non-dissolvable) particles.

The phrase "in planar contact" or "planarly contacting" is used to indicate that one layer or layered structure is contacting (and disposed either above or below) another layer or layered structure. Such contact is facial contact, rather than edge contact.

The term "organic layer" as used herein refers to a layer that comprises a majority (e.g., greater than 50 weight percent) of one or more materials including hydrocarbon compounds or their halogenated analogues, a three-dimensionally continuous polymeric matrix, or both.

The term "inorganic layer" as used herein refers to a layer that comprises a majority (e.g., greater than 50 weight percent) of one or more materials lacking compounds having carbon-hydrogen bonds or their halogenated analogues.

As used herein, "nanostructured" refers to a surface that includes topography in the form of nanofeatures, wherein the nanofeatures comprise material that define the surface, and wherein at least one of the height of nanofeatures or the width of nanofeatures is less than about a micron (i.e., a micrometer, or 1000 nanometers).

As used herein, "index of refraction" refers to a refractive index of a material in the plane of the material with respect to light at 633 nm and normal incidence, unless otherwise indicated.

As used herein, "gas" refers to any material is the gaseous phase at standard temperature and pressure (i.e., 0 degrees Celsius and $10^5$ pascals).

As used herein, "birefringent" means that the indices of refraction in orthogonal x, y, and z directions are not all the same. Index of refraction is designated as $n_x$, $n_y$, and $n_z$ for x, y, and z directions, respectively. For the layers described herein, the axes are selected so that x and y axes are in the plane of the layer and the z axis is normal to the plane of the layer and typically corresponds to the thickness or height of the layer. Where a refractive index in one in-plane direction is larger than a refractive index in another in-plane direction, the x-axis is generally chosen to be the in-plane direction with the largest index of refraction.

As used herein, "transparent to visible light" refers to the level of transmission of the unpatterned substrate or of the article being 60 percent or more, 70 percent or more, 80 percent or more, 90 percent or more, 95 percent or more, or 98 percent or more transmissive to at least one polarization state of visible light, where the percent transmission is normalized to the intensity of the incident, optionally polarized light. The term "visible" in connection with "transparent to visible light" is modifying the term "light," so as to specify the wavelength range of light for which the article is transparent.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a", "an", and "the" are not intended to refer to only a singular entity, but include the general class of which a specific example may be used for illustration. The terms "a", "an", and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and preferably by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein as a modifier to a property or attribute, the term "generally", unless otherwise specifically defined, means that the property or attribute would be readily recognizable by a person of ordinary skill but without requiring absolute precision or a perfect match (e.g., within +/−20% for quantifiable properties). The term "substantially", unless otherwise specifically defined, means to a high degree of approximation (e.g., within +/−10% for quantifiable properties) but again without requiring absolute precision or a perfect match. Terms such as same, equal, uniform, constant, strictly, and the like, are understood to be within the usual tolerances or measuring error applicable to the particular circumstance rather than requiring absolute precision or a perfect match.

Articles

In a first aspect, an article is provided. The article comprises:
- a first layer comprising a nanostructured first surface comprising nanofeatures and an opposing second surface, wherein the nanostructured first surface comprises recessed features, or protruding features formed of a single composition, or both recessed and protruding features; and
- a second layer comprising a first major surface attached to a portion of the nanofeatures, wherein the second layer is an organic layer,
- wherein the nanofeatures of the first layer and the first major surface of the second layer together define at least one void.

It has been discovered that it is possible to form an article containing one or more voids and exhibiting a refractive index difference, in which the nanostructured surface is protected from damage or contamination.

FIG. 1 is a schematic cross-sectional view of an exemplary article 1000 according to the present application. The article 1000 comprises a first layer 110 comprising a nanostructured first surface 112 comprising nanofeatures 114 and an opposing second surface 116; and a second layer 120 comprising a first major surface 122 attached to a portion of the nanofeatures 114, wherein the second layer 120 is an organic layer. The nanostructured first surface comprises recessed features, or protruding features formed of a single composition, or both recessed and protruding features. By a "single composition" is meant that the protruding features are made of the same material throughout the protruding feature instead of including one portion of a feature having a differing composition than another portion of the same feature. In some embodiments, the protruding features have the same composition as the (e.g., bulk of) the first layer 110. In some embodiments, the recessed features are defined by a structure that is formed of a single composition (e.g., the first layer). In some embodiments, the composition can be, for instance, a polymer, a polymer blend, and/or a polymeric matrix containing nanoparticles dispersed in the polymeric matrix. In some embodiments, the composition can be, for instance, an inorganic material. An advantage of the protruding features consisting of one composition is that often the protruding features can be formed by a relatively simple nanoreplication method, e.g., as described in the Examples below with respect to Film K.

Optionally, the second layer 120 comprises a polymeric material (i.e., a three-dimensionally continuous polymeric phase). The second layer 120 may comprise a crosslinked material or a crosslinkable material. The nanofeatures 114 of the first layer 110 and the first major surface 122 of the second layer 120 together define at least one void 130 (e.g., in the form of the negative space between the first layer 110 and the second layer 120). The void(s) 130 are not filled with a solid or liquid, but rather contain a vacuum or a gas. Suitable gases include for example ambient air (e.g., atmospheric air in its natural state), a gas, or a gas blend (e.g., 90% nitrogen and 10% oxygen). In some embodiments, suitable gases can include at least one inert gas (e.g., nitrogen, argon, helium, xenon, etc.). In the embodiment shown in FIG. 1, the nanostructured first surface 112 comprises both recessed features 117 and protruding features 119. Alternatively, an article can include just one of recessed features 117 or protruding features 119. An advantage of using only recessed features is that the second layer can contact a major surface of the first layer rather than the tops of a number of protruding features, and the resulting article may be less fragile than one having protruding features. The embodiment shown in FIG. 1 includes both individual voids 130 provided in recessed features 117 and a large connected void 130 that extends around a plurality of protruding features 119.

Figure 2A:
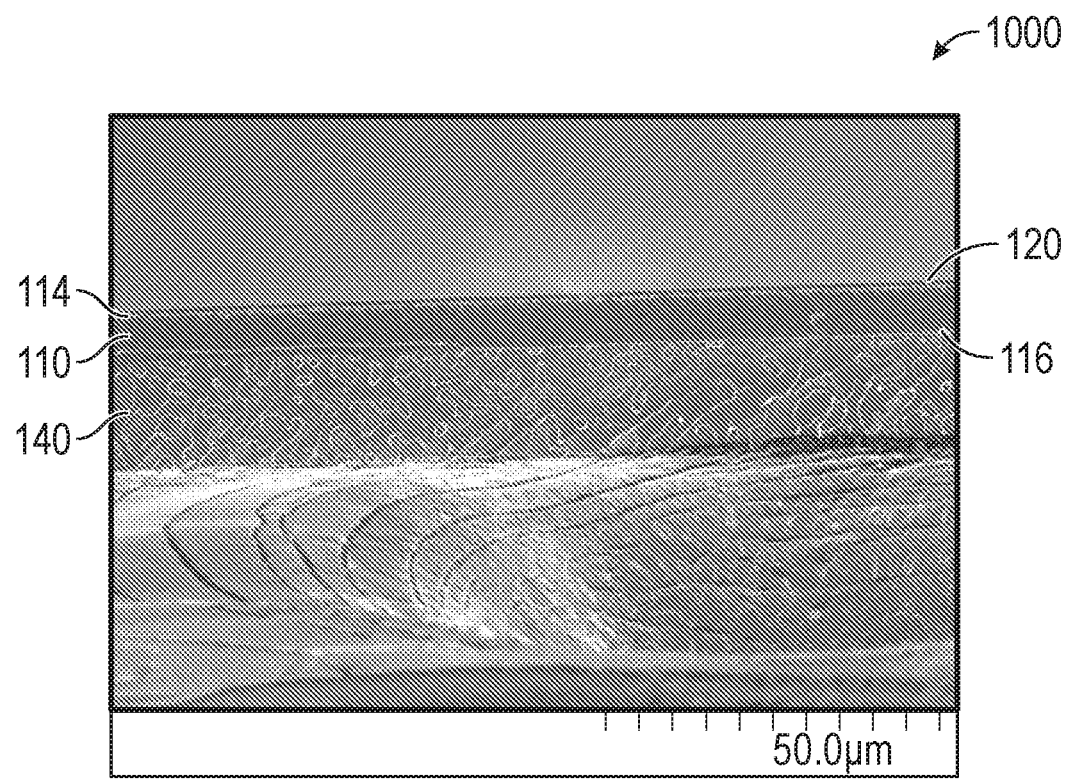
FIG. 2A is a scanning electron microscopy (SEM) image of a cross-section of the exemplary article of Example 7 at a magnification of 1,000×, according to the present application.
Figure 2B:
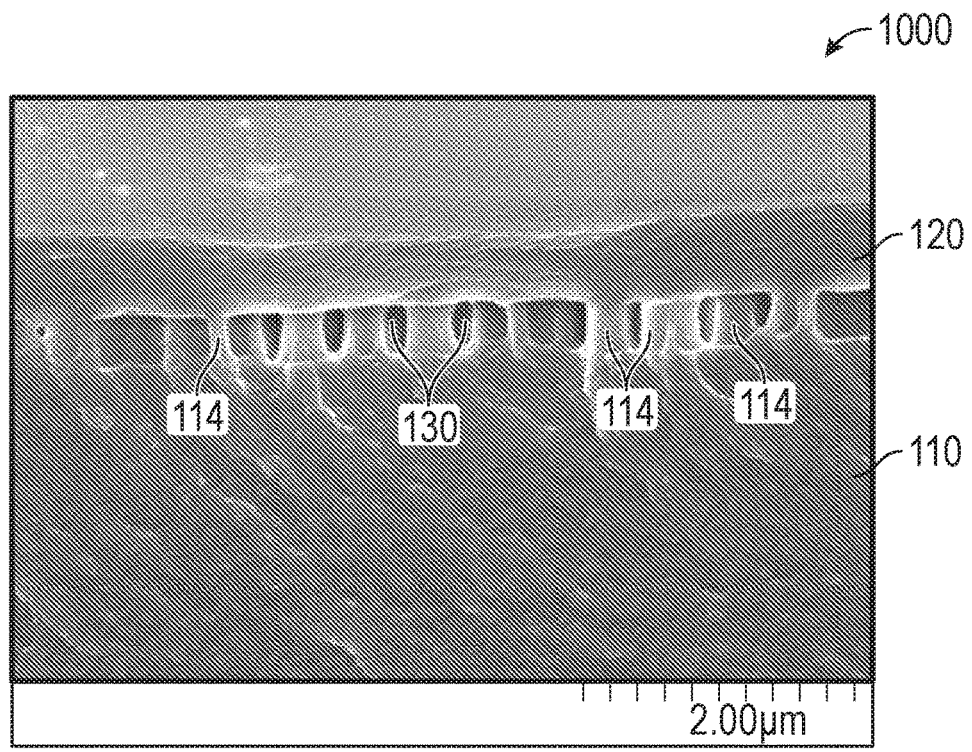
FIG. 2B is an SEM image of a cross-section of the exemplary article of FIG. 2A at a magnification of 20,000×.
Figure 2C:
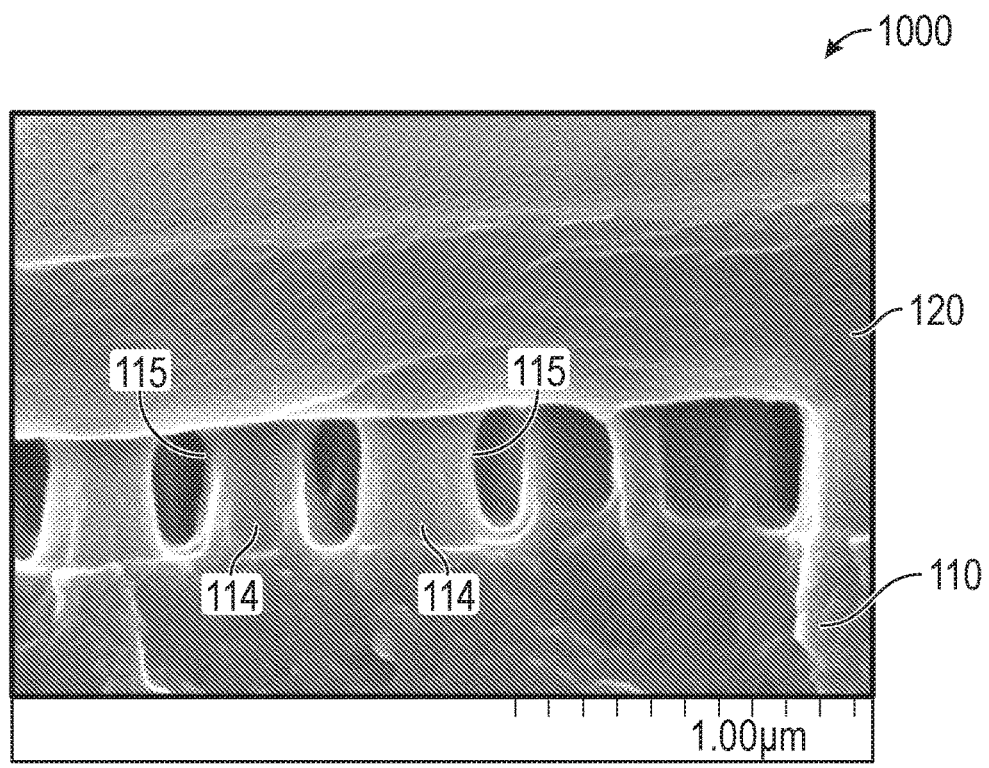
FIG. 2C is an SEM image of a cross-section of the exemplary article of FIG. 2A at a magnification of 50,000×.

FIGS. 2A-2C provide SEM images of three magnifications of an article 1000 made according to Example 7 below. Referring to FIG. 2A (i.e., magnification of 1,000×), the article 1000 comprises a first layer 110 comprising a plurality of nanofeatures 114, and a second layer 120 attached to a portion of the nanofeatures 114. This article 1000 further comprises a third layer 140 attached to an opposing second surface 116 of the first layer 110. Referring to FIG. 2B (i.e., magnification of 20,000×), the first layer 110, a nanostructured first surface 112 comprising nanofeatures 114, and a second layer 120 attached to a portion of the nanofeatures 114 and defining at least one void 130, of the article 1000 are shown. In the embodiment of FIG. 2B, one connected void 130 is present that surrounds many, most, or all of the (e.g., protruding) nanofeatures 114. Referring to FIG. 2C (i.e., magnification of 50,000×), the shapes of some of the nanofeatures 114 are seen more clearly.

Figure 7:
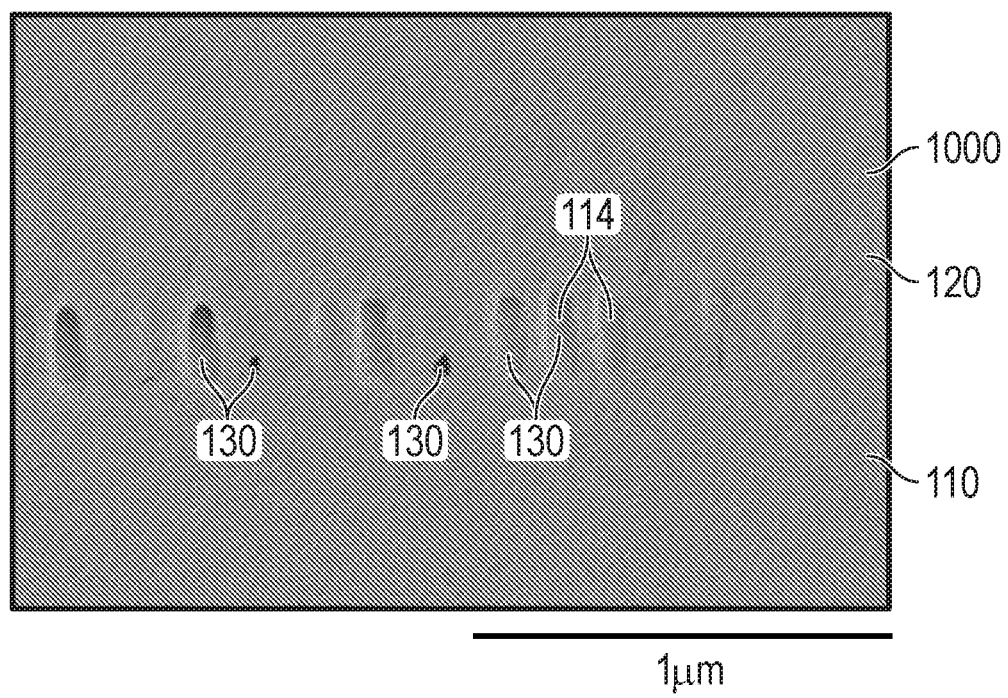
FIG. 7 is an SEM image of a cross-section of a portion of the exemplary article of Example 1 according to the present application.

Referring to FIG. 7, an SEM image is provided of a cross-section of an exemplary article 1000 prepared in Example 1 below. A plurality of voids 130 are defined by the space between the first layer 110 and the second 120 that is attached to a portion of the (e.g., recessed) nanofeatures 114 of the first layer 110. It is noted that the cross-section shows a portion of the voids 130 closer to an edge than the center of the voids 130.

Optionally, the second layer 120 may be substantially planar. As used herein, "substantially planar" with respect to a layer means that a surface of the layer is essentially free of recesses and/or protrusions extending above and/or below a plane of the layer, the recesses and/or protrusions having a depth or height of greater than 100 micrometers, 90 micrometers, 80 micrometers, 70 micrometers, 60 micrometers, 50 micrometers, 40 micrometers, 30 micrometers, 25 micrometers, 20 micrometers, 15 micrometers, 10 micrometers, 9 micrometers, 8 micrometers, 7 micrometers, 6 micrometers, 5 micrometers, 4 micrometers, 3 micrometers, 2 micrometers, or greater than 1 micrometer. Typically, recesses and/or protrusions have a depth or height of less than 1 millimeter, such as 900 micrometers or less, 800 micrometers, 700 micrometers, 600 micrometers, 500 micrometers, 400 micrometers, or 300 micrometers or less. The depth or height of a recess or a protrusion present on a layer surface can be measured with a confocal microscope.

In some embodiments, the first layer is also an organic layer, such as a polymeric layer. The first layer 110 may comprise a crosslinked material or a crosslinkable material. The first layer 110 may have a refractive index in the range of 1.2 to 2.2, or in the range of 1.4 to 1.75, for example. The refractive index refers to the refractive index measured at 632 nm, unless specified differently or unless the context clearly indicates differently. In some embodiments, the first layer 110 has a refractive index of 1.3 or greater, 1.5 or greater, 1.6 or greater, 1.7 or greater, or 1.75 or greater; and a refractive index of 2.2 or less, 2.1 or less, or 2.0 or less. The article 1000 provides a refractive index contrast (absolute value of the difference in the refractive index of the first layer 110 and the refractive index of the void(s) 130) across an opposing second surface 116 of the first layer 110 (e.g., due at least partially to the presence of the void(s) 130). In some embodiments, the refractive index contrast is in a range of 0.1 to 1.0, 0.3 to 1.0, or 0.5 to 1.0.

Figure 9:
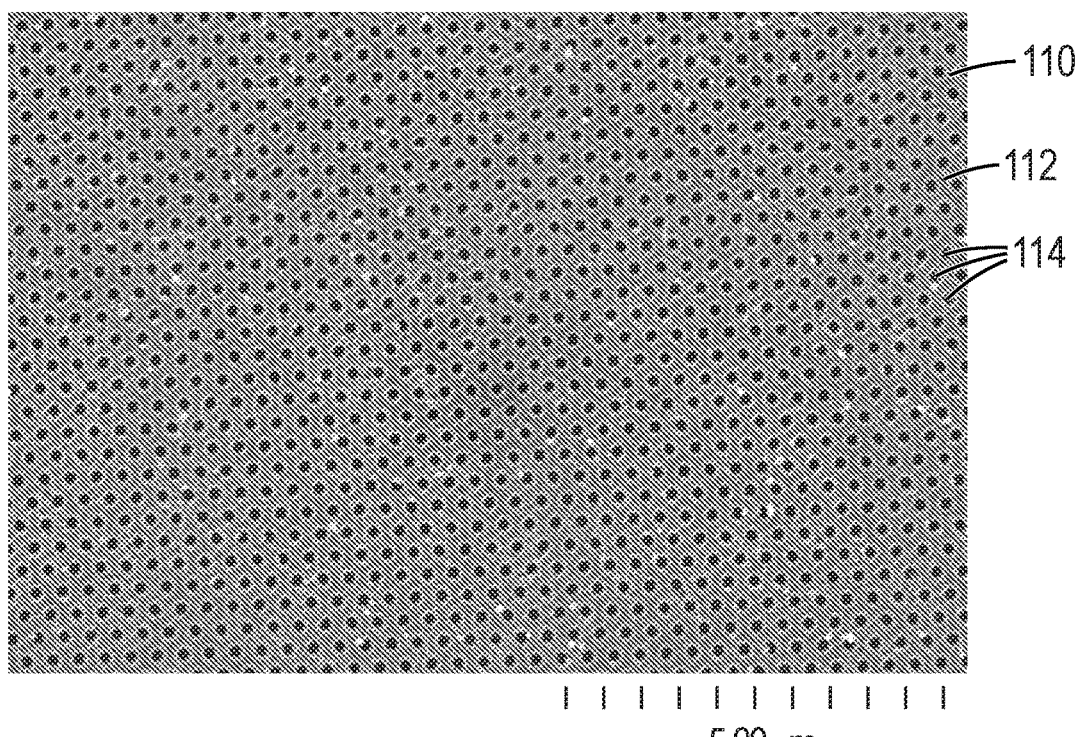
FIG. 9 is an SEM image of a top view of a portion of the nanostructured first layer including recessed nanofeatures of Structured Sample A, according to the present application.

In some embodiments, the first layer is an inorganic layer, such as a ceramic layer. For instance, co-owned International Application Publication No. WO 2018/044565 (Humpal et al.) describes forming shaped gel, aerogel, and sintered articles. A shaped gel article is a polymerized product formed by casting a sol containing surface-modified colloidal silica particles into a mold cavity followed by polymerizing the sol. The shaped gel retains both a size and a shape identical to the mold cavity. Removal of organic solvent medium from the shaped gel article provides an aerogel article. Heating a shaped gel article to remove organic matrix from the polymerized product provides a sintered article. Shaped gel articles can replicate the features of a mold cavity even if the cavity dimensions are quite small. This is possible at least when the casting sol has a relatively low viscosity and contains silica particles having an average particle size no greater than 100 nanometers. FIG. 9 provides an SEM image of a top view of a portion of a nanostructured first layer 110 including recessed nanofeatures 114 in the surface 112 of Structured Sample A, which was formed using the method described in WO 2018/044565.

Suitable inorganic materials are not limited to silicon oxide, but can comprise an oxide, a nitride, a carbide, or a boride of a metal or a nonmetal, or combinations thereof. In some embodiments, the inorganic material comprises an oxide of titanium, indium, tin, tantalum, zirconium, niobium, aluminum, silicon, or combinations thereof. For instance, suitable oxides include silica, aluminum oxides such as alumina, titanium oxides such as titania, indium oxides, tin oxides, indium tin oxide (ITO), hafnium oxide, tantalum oxide, zirconium oxide, niobium oxide, and combinations thereof. When an inorganic material is employed as the first layer, the article may be useful as an optical element, such as a diffraction grating.

Figure 6:
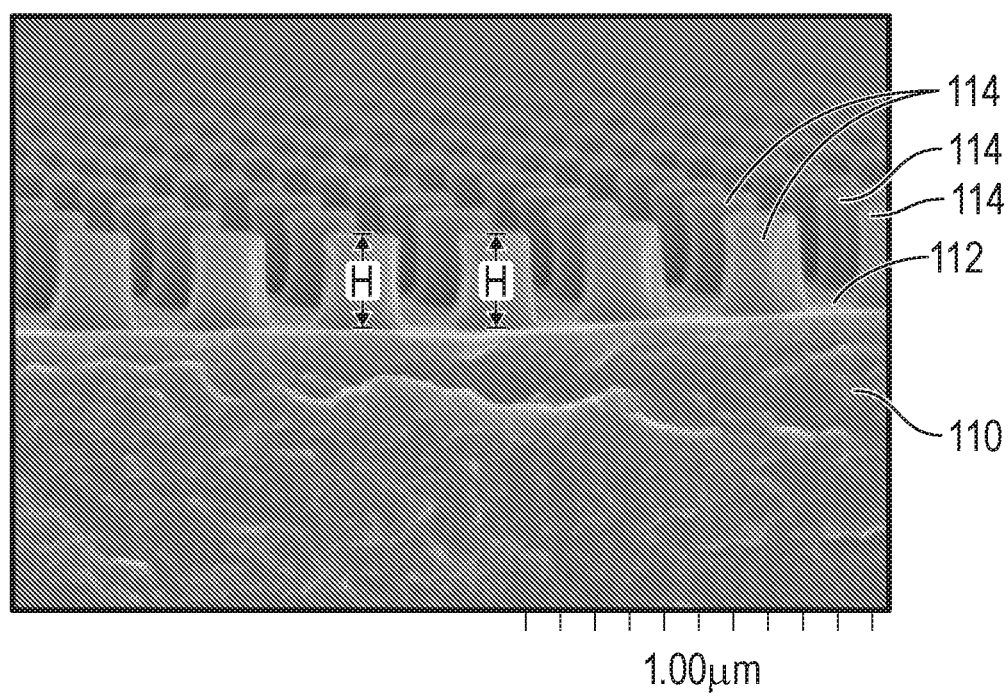
FIG. 6 is an SEM image of a portion of the nanostructured first layer including protruding nanofeatures of Film K, according to the present application.

Nanostructures are structures having at least one dimension, such as width or height, less than 1 micrometer. Nanostructured surfaces can be made using a tool having a nanostructured surface. In some embodiments, the tool includes a plurality of particles partially embedded in a substrate. Useful techniques for making the tool are described in U.S. Publication No. 2014/0193612 (Yu et al.) and U.S. Pat. No. 8,460,568 (David et al.). The nanostructured surface of the tool can be characterized by atomic force microscopy (AFM). Further details on useful nanostructured surfaces and methods of making the nanostructured surfaces can be found as described in PCT Publication Nos. WO 2009/002637A2 (Zhang et al.) and WO 2017/205174 (Freier et al.). Referring to FIG. 6, an SEM of a first layer 110 is shown. The first layer 110 comprises a nanostructured first surface 112 comprising nanofeatures 114.

Examples of characteristics of nanofeatures include pitch, height, depth, aspect ratio, diameter, sidewall angle, and shape. Pitch refers to the distance between adjacent nanofeatures, typically measured from their topmost portions. Height refers to the height of protruding nanofeatures measured from their base (in contact with the underlying layer) to the topmost portion. Depth refers to the depth of recessed nanofeatures measured from their topmost portion (the opening at a major surface of the layer) to the lowermost portion. Aspect ratio refers to the ratio of the cross-sectional width (widest portion) to height or depth of the nanofeatures. Diameter refers to the longest line that can be drawn across a nanofeature from one surface, through a center point, and to an opposing surface at a point along the height or depth of a nanofeature. Sidewall angle refers to the angle formed between a sidewall of a nanofeature and the major surface of the layer from which the nanofeature protrudes or into which the nanofeature recedes. The sidewall angle may differ at various points along the height or depth of a nanofeature. Shape refers to the cross-sectional shape of the nanofeatures. Optionally, the cross-sectional shapes (and diameters) may differ at various points along the height or depth of a nanofeature.

As shown in FIG. 6, in certain embodiments, the nanostructured first surface 112 of the first layer 110 comprises nanofeatures 114 having a regular height H, whereas in other embodiments the nanostructured first surface 112 of the first layer 110 comprises nanofeatures 114 having varying heights. This can depend on the method of forming the nanostructured surface. Referring again to FIG. 1, at least one dimension of height H or width W of the nanofeatures 114 is less than a micrometer, to provide the required small size of the features. In some embodiments, a (e.g., average) height H of the nanofeatures 114 is less than a micrometer, 950 nanometers (nm) or less, 900 nm or less, 850 nm or less, 800 nm or less, 750 nm or less, 700 nm or less, 650 nm or less or 600 nm or less; and a height H of the nanofeatures 114 is 5 nm or greater, 10 nm or greater, 20 nm or greater, 30 nm or greater, 50 nm or greater, 75 nm or greater, 100 nm or greater, 150 nm or greater, 200 nm or greater, 250 nm or greater, 300 nm or greater, 350 nm or greater, 400 nm or greater, 450 nm or greater, or 500 nm or greater. In some embodiments, a (e.g., average) width W of the nanofeatures 114 is less than a micrometer, 950 nanometers (nm) or less, 900 nm or less, 850 nm or less, 800 nm or less, 750 nm or less, 700 nm or less, 650 nm or less or 600 nm or less; and a width W of the nanofeatures 114 is 5 nm or greater, 10 nm or greater, 20 nm or greater, 30 nm or greater, 50 nm or greater, 75 nm or greater, 100 nm or greater, 150 nm or greater, 200 nm or greater, 250 nm or greater, 300 nm or greater, 350 nm or greater, 400 nm or greater, 450 nm or greater, or 500 nm or greater.

Figure 4:
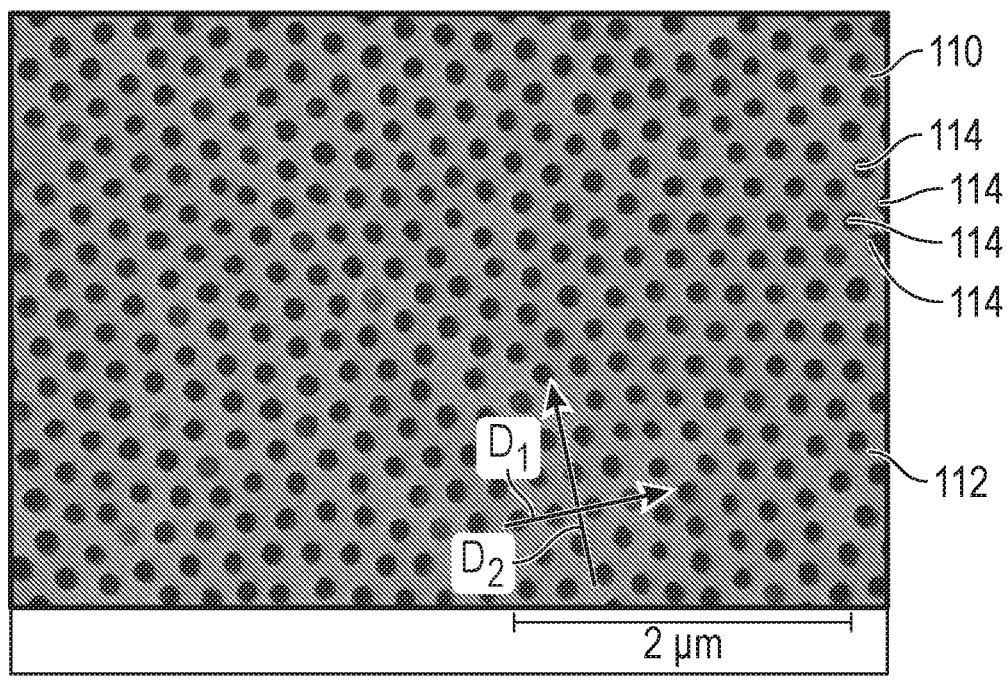
FIG. 4 is an SEM image of a top view of a portion of the nanostructured first layer including recessed nanofeatures of Film A, according to the present application.
Figure 5:
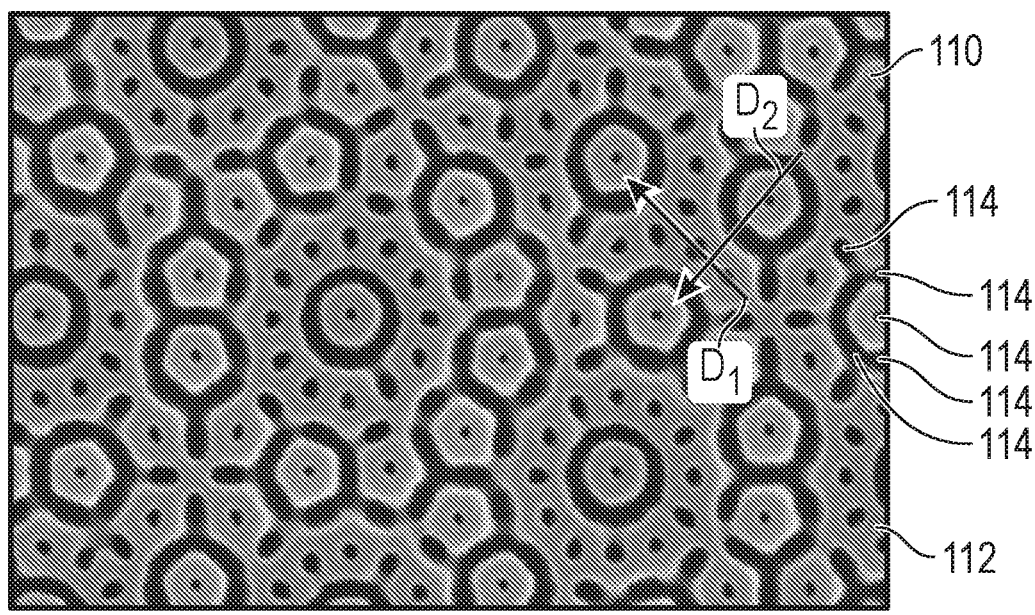
FIG. 5 is an SEM image of a top view of a portion of the nanostructured first layer including recessed nanofeatures of Film C, according to the present application.

The nanostructured surfaces can each comprise nanofeatures such as, for example, nano-columns, or continuous nano-walls comprising nano-columns. Referring to each of FIG. 1 and FIG. 2C, in certain embodiments, the nanofeatures 114 comprise at least one non-linear surface 115 in at least one direction. For instance, some of the nanofeatures 114 shown in FIG. 1 have a curved surface 115 (e.g., at a lower surface of the recessed features 114), and at least some of the nanofeatures 114 shown in FIG. 2C have a curved surface 115 (e.g., at a side wall surface of the protruding features 114). Any shape conveniently formed by a nanoreplication process can be employed for the nanofeatures 114 (e.g., prisms, ridges, linear and/or curved polygons). As used herein, "nanoreplication" refers to a process of molding a nanostructured surface from another nanostructured surface using, for example, curable or thermoplastic materials. Nanoreplication is further described, for instance, in "Micro/Nano Replication", Shinill Kang, John Wiley & Sons, Inc., 2012, Chapters 1 and 5-6. The nanofeatures optionally have steep side walls that are generally perpendicular to the opposing second surface of the first or second layer. Referring to FIG. 4, certain individual nanofeatures 114 can be spaced equally in one direction D1 along the nanostructured first surface 112 but not in an orthogonal direction D2. In some embodiments, certain individual nanofeatures 114 are spaced equally in at least two directions D1 and D2 along the nanostructured first surface 112 (not shown). Referring to FIG. 5, certain individual nanofeatures 114 not spaced equally in either direction D1 along the nanostructured first surface 112 or in an orthogonal direction D2.

In any embodiment, the second layer has an average thickness of greater than 50 nm, such as 100 nm or greater, 200 nm or greater, 300 nm or greater, 400 nm or greater, 500 nm or greater, 700 nm or greater, 900 nm or greater, 1 micrometer or greater, 1.25 micrometers or greater, 1.5 micrometers or greater, 1.75 micrometers or greater, 2 micrometers or greater, 2.25 micrometers or greater, 2.5 micrometers or greater, 2.75 micrometers or greater, or 3 micrometers or greater; and an average thickness of 1 millimeter (mm) or less, 0.75 mm or less, 0.5 mm or less, 0.25 mm or less, 0.1 mm or less, 0.05 mm or less, or 0.01 mm or less. In select embodiment, the second layer is nonporous.

In certain embodiments, the second layer comprises a polymeric film. A polymeric "film" is a polymer material in the form of a generally flat sheet that is sufficiently flexible and strong to be processed in a roll-to-roll fashion. Polymeric films used in articles described herein are sometimes referred to as base films. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from about 5 micrometers to 1000 micrometers. Similarly, the first layer can comprise a film that is generally flat other than the nanostructured surface.

Referring again to FIG. 1, in the embodiment shown, the article 1000 further comprises a third layer 140 attached to the opposing second surface 116 of the first layer 110. In some embodiments, the article 1000 further comprises a fourth layer 150 attached to a second major surface 124 of the second layer 120. Suitable third layers and/or fourth layers comprise inorganic materials and organic materials; in some embodiments the third layer 140, the fourth layer 150, or both comprise a polymeric layer. Either or both of the third or fourth layers may be referred to as substrates. Suitable materials for a polymer substrate include copolyester polymers such as polyethylene terephthalate (PET) and glycol modified polyethylene terephthalate (PETg), cyclo-olefin polymer (COP), cyclo-olefin copolymer (COC), poly (ethylenenaphthalate) (PEN), polycarbonate (PC), acrylate polymers such as alicyclic acrylate or poly(methylmethacrylate) (PMMA), polyimide (PI), polysulfone, and cast cellulose diacetate, and mixtures or copolymers including these materials. A thickness of a substrate is not particularly limited, and may range from a thickness of 5 micrometers to 1 centimeter, 10 micrometers to 500 millimeters, or 50 micrometers to 250 millimeters. Stated another way, the polymer substrate may have a thickness of 5 micrometers or more, 7 micrometers or more, 10 micrometers or more, 20 micrometers or more, 35 micrometers or more, 50 micrometers or more, 75 micrometers or more, 100 micrometers or more, 250 micrometers or more, 500 micrometers or more, 750 micrometers or more, or 1 millimeter or more; and 1 centimeter or less, 9 millimeters or less, 8 millimeters or less, 7 millimeters or less, 6 millimeters or less, 5 millimeters or less, 3.5 millimeters or less, 2.5 millimeters or less, 1 millimeter or less, 0.50 millimeters or less, 0.25 millimeters or less, or 0.10 millimeters or less. Further, additional suitable substrates could include painted or graphics printed substrates including metals, plastics, and glass.

Optionally, one or both of the third layer 140 or the fourth layer 150 comprises a low-birefringent layer. By "low-birefringent" is meant a layer that has a retardation of 25 nm or less. Suitable materials for a low-birefringent layer include for instance polysulfone, acrylate polymers such as polymethyl methacrylate and alicyclic acrylate, polycarbonate polymers, cycloolefin polymers and copolymers, copolyester polymers (e.g., PETg), and cast cellulose diacetate.

Preferably, the article is transparent to visible light. An advantage to having the article transparent to visible light is its suitability for numerous applications, for instance optical information displays and OLED devices.

Examples of suitable materials for the first layer 110, the second layer 120, or both, include the following: high index organic materials; a nanoparticle filled polymer material; polymers filled with high index inorganic materials; and high index conjugated polymers. Examples of high index polymers and monomers are described in C. Yang, et al., Chem. Mater. 7, 1276 (1995), and R. Burzynski, et al., Polymer 31, 627 (1990) and U.S. Pat. No. 6,005,137, all of which are incorporated herein by reference to the extent that they do not contradict the present description. Examples of polymers filled with high index inorganic materials are described in U.S. Pat. No. 6,329,058. Examples of nanoparticles for the nanoparticle filled polymer material include the following high index materials: $TiO_2$, $ZrO_2$, $H_1O_2$, or other inorganic materials. In some embodiments, suitable materials for the first layer 110, the second layer 120, or both, include a low refractive index material, such as those described in U.S. Pat. No. 8,012,567 (Gaides et al.); or an ultralow refractive index material, such as those described in U.S. Pat. App. Pub. No. 2012/0038990 (Hao et al.). In select embodiments, the first layer 110, the second layer 120, or both, comprise an acrylic polymer or copolymer, such as at least one polymerizable component selected from (meth) acrylate monomers, (meth)acrylate oligomers, and mixtures thereof. As used herein, "monomer" or "oligomer" is any substance that can be converted into a polymer. The term "(meth)acrylate" refers to both acrylate and methacrylate compounds. In select embodiments, the first layer 110 and the second layer 120 comprise the same material.

In some embodiments, a polymerizable composition used for forming the first layer and/or the second layer comprises (e.g. solely) a crosslinking agent as the (meth)acrylate monomer comprising at least three (meth)acrylate functional groups. In some embodiments, the crosslinking monomer comprises at least four, five or six (meth)acrylate functional groups. Acrylate functional groups tend to be favored over (meth)acrylate functional groups. Preferred commercially available crosslinking agents include for example trimethylolpropane triacrylate (commercially available from Sartomer Company, Exton, PA, under the trade designation "SR351"), ethoxylated trimethylolpropane triacrylate (commercially available from Sartomer Company, under the trade designation "SR454"), pentaerythritol tetraacrylate, pentaerythritol triacrylate (commercially available from Sartomer Company under the trade designation "SR444"), dipentaerythritol pentaacrylate (commercially available from Sartomer Company under the trade designation "SR399"), ethoxylated pentaerythritol tetraacrylate, ethoxylated pentaerythritol triacrylate (commercially available from Sartomer under the trade designation "SR494"), dipentaerythritol hexaacrylate, and tris(2-hydroxy ethyl) isocyanurate triacrylate (commercially available from Sartomer under the trade designation "SR368").

Useful multi-(meth)acrylate monomers and oligomers include:

(a) di(meth)acryl containing monomers such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, and tripropylene glycol diacrylate;

(b) tri(meth)acryl containing monomers such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, and tris(2-hydroxyethyl)isocyanurate triacrylate; and (c) higher functionality (meth)acryl containing monomers such as ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate.

In one embodiment, suitable polymerizable compositions include at least one monomeric or oligomeric (meth)acrylate, preferably a urethane (meth)acrylate. Typically, the monomeric or oligomeric (meth)acrylate is multi(meth) acrylate. The term "(meth)acrylate" is used to designate esters of acrylic and methacrylic acids, and "multi(meth) acrylate" designates a molecule containing more than one (meth)acrylate group, as opposed to "poly(meth)acrylate" which commonly designates (meth)acrylate polymers. Most often, the multi(meth)acrylate is a di(meth)acrylate, but it is also contemplated to employ tri(meth)acrylates, tetra(meth) acrylates and so on. Suitable monomeric or oligomeric (meth)acrylates include alkyl (meth)acrylates such as methyl acrylate, ethyl acrylate, 1-propyl acrylate, methyl methacrylate, 2-phenoxyethyl acrylate, tetrahydrofurfuryl acrylate, and t-butyl acrylate. The acrylates may include (fluoro)alkylester monomers of (meth)acrylic acid, the monomers being partially and or fully fluorinated, such as, trifluoroethyl (meth)acrylate.

Examples of commercially available multi(meth)acrylate resins include the DIABEAM series from Mitsubishi Rayon Co., LTD.; the DINACOL series from Nagase & Company, Ltd.; the NK ESTER series from Shin-Nakamura Chemical Co., Ltd.; the UNIDIC series from Dainippon Ink & Chemicals, Inc., the ARONIX series from Toagosei Co., LTD.; the BLENMER series manufactured by NOF Corp.; the KAYARAD series from Nippon Kayaku Co., Ltd., the LIGHT ESTER series and LIGHT ACRYLATE series from Kyoeisha Chemical Co., Ltd.

Oligomeric urethane multi(meth)acrylates may be obtained commercially, for example from IGM Resins under the trade designation "Photomer 6000 Series", such as "Photomer 6010" and "Photomer 6210", and also from Sartomer Company under the trade designation "CN 900 Series", such as "CN966B85", "CN964" and "CN972". Oligomeric urethane (meth)acrylates are also available from Surface Specialties, such as available under the trade designations "Ebecryl 8402", "Ebecryl 8807" and "Ebecryl 4827". Oligomeric urethane (meth)acrylates may also be prepared by the initial reaction of an alkylene or aromatic diisocyanate of the formula OCN—R3-NCO with a polyol. Most often, the polyol is a diol of the formula HO—R4-OH wherein R3 is a C2-100 alkylene or an arylene group and R4 is a C2-100 alkylene group. Alkylene and arylene groups may include ether or ester groups. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally preferred. A particularly preferred compound of this type may be prepared from hexane diisocyanate, poly(caprolactone)diol and 2-hydroxyethyl methacrylate. In at least some cases, the urethane (meth)acrylate is preferably aliphatic.

The polymerizable compositions can be mixtures of various monomers and or oligomers, having the same or differing reactive functional groups. Polymerizable compositions comprising two or more different functional groups may be used, including the following; (meth)acrylate, epoxy and urethane. The differing functionality may be contained in different monomeric and or oligomeric moieties or in the same monomeric and or oligomeric moiety. For example, a resin composition may comprise an acrylic or urethane resin having an epoxy group and or a hydroxyl group in the side chain, a compound having an amino group and, optionally, a silane compound having an epoxy group or amino group in the molecule.

The compositions are polymerizable using conventional techniques such as thermal cure, photocure (cure by actinic radiation) and or e-beam cure. In one embodiment, the composition is photopolymerized by exposing it to ultraviolet (UV) and or visible light. More generally, a photopolymerizable composition is typically cured using actinic radiation, such as UV radiation, e-beam radiation, visible radiation, or any combination thereof. The skilled practitioner can select a suitable radiation source and range of wavelengths for a particular application without undue experimentation.

Conventional curatives and/or catalysts may be used in the polymerizable compositions and are selected based on the functional group(s) in the composition. Multiple curatives and or catalysts may be required if multiple cure functionality is being used. Combining one or more cure techniques, such as thermal cure, photocure and e-beam cure, is within the scope of the present disclosure.

Furthermore, the polymerizable compositions can comprise at least one other monomer and or oligomer (that is, other than those described above, namely the monomeric or oligomeric (meth)acrylate and the oligomeric urethane (meth)acrylate). This other monomer may reduce viscosity and/or improve thermomechanical properties and/or increase refractive index. Monomers having these properties include acrylic monomers (that is, acrylate and methacrylate esters, acrylamides and methacrylamides), styrene monomers and ethylenically unsaturated nitrogen heterocycles.

Also included are (meth)acrylate esters having other functionality. Compounds of this type are illustrated by the 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate and phenoxyethyl acrylate. The reaction product of tetrabromobisphenol A diepoxide and (meth)acrylic acid is also suitable. The other monomer may also be a monomeric N-substituted or N,N-disubstituted (meth)acrylamide, especially an acrylamide. These include N-alkylacrylamides and N,N-dialkylacrylamides, especially those containing C1-4 alkyl groups. Examples are N-isopropylacrylamide, N-t-butylacrylamide, N,N-dimethylacrylamide and N,N-diethylacrylamide. The term "(meth)acrylamide" means acrylamide and methacrylamide.

Styrenic compounds suitable for use as the other monomer include styrene, dichlorostyrene, 2,4,6-trichlorostyrene, 2,4,6-tribromostyrene, 4-methylstyrene and 4-phenoxystyrene. Ethylenically unsaturated nitrogen heterocycles include N-vinylpyrrolidone and vinylpyridine.

Photopolymerizable compositions in accordance with the present disclosure typically include at least one photoinitiator. Suitable exemplary photoinitiators are those available under the trade designations OMNIRAD from IGM Resins (Waalwijk, The Netherlands) and include 1-hydroxycyclohexyl phenyl ketone (OMNIRAD 184), 2,2-dimethoxy-1,2-diphenylethan-1-one (OMNIRAD 651), bis(2,4,6 trimethylbenzoyl)phenylphosphineoxide (OMNIRAD 819), 1-[4-(2-hydroxyethoxy)phenyl]-2-hydroxy-2-methyl-1-propane-1-one (OMNIRAD 2959), 2-benzyl-2-dimethylamino-1-(4-morpholinophenyl)butanone (OMNIRAD 369), 2-Dimethylamino-2-(4-methyl-benzyl)-1-(4-morpholin-4-yl-phenyl)-butan-1-one (OMNIRAD 379), 2-methyl-1-[4-(methylthio)phenyl]-2-morpholinopropan-1-one (OMNIRAD 907), Oligo[2-hydroxy-2-methyl-1-[4-(1-methylvinyl) phenyl]propanone] ESACURE ONE (Lamberti S.p.A., Gallarate, Italy), 2-hydroxy-2-methyl-1-phenyl propan-1-one (DAROCUR 1173), 2, 4, 6-trimethylbenzoyldiphenylphosphine oxide (OMNIRAD TPO), and 2, 4, 6-trimethylbenzoylphenyl phosphinate (OMNIRAD TPO-L). Additional suitable photoinitiators include for example and without limitation, benzyl dimethyl ketal, 2-methyl-2-hydroxypropiophenone, benzoin methyl ether, benzoin isopropyl ether, anisoin methyl ether, aromatic sulfonyl chlorides, photoactive oximes, and combinations thereof.

In some embodiments, a cationic photoinitiator is present in compositions that include an epoxy component, for example. Further, a thermal initiator can also optionally be present in a photopolymerizable composition described herein. For instance, a free-radical photoinitiator, a cationic photoinitiator, a thermal photoinitiator, or any combination thereof may be present in a photopolymerizable composition.

Suitable cationic photoinitiators include for instance and without limitation, bis[4-diphenylsulfoniumphenyl]sulfide bishexafluoroantimonate; thiophenoxyphenylsulfonium hexafluoroantimonate (available as CHIVACURE 1176 from Chitec (Houston, TX), tris(4-(4-acetylphenyl)thiophenyl)sulfonium tetrakis(pentafluorophenyl)borate, tris(4-(4-acetylphenyl)thiophenyl)sulfonium tris[(trifluoromethyl)sulfonyl]methide, and tris(4-(4-acetylphenyl)thiophenyl)sulfonium hexafluorophosphate, [4-(1-methylethyl)phenyl](4-methylphenyl) iodonium tetrakis(pentafluorophenyl)borate, 4-[4-(2-chlorobenzoyl)phenylthio]phenylbis(4-fluorophenyl)sulfonium hexafluoroantimonate, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., (Kyoto, JP) TK-1 available from San-Apro Ltd., or HS-1 available from San-Apro Ltd.)

In some embodiments, a photoinitiator is present in a photopolymerizable composition in an amount of up to about 5% by weight, based on the total weight of polymerizable components in the photopolymerizable composition (e.g., not including components such as particles). In some cases, a photoinitiator is present in an amount of about 0.1-5% by weight, 0.2-5% by weight, or 0.5-5% by weight, based on the total weight of the photopolymerizable composition.

In some embodiments, a thermal initiator is present in a polymerizable composition in an amount of up to about 5% by weight, such as about 0.1-5% by weight, based on the total weight of polymerizable components in the polymerizable composition. Suitable thermal initiators include for instance and without limitation, peroxides such as benzoyl peroxide, dibenzoyl peroxide, dilauryl peroxide, cyclohexane peroxide, methyl ethyl ketone peroxide, hydroperoxides, e.g., tert-butyl hydroperoxide and cumene hydroperoxide, dicyclohexyl peroxydicarbonate, 2,2,-azo-bis(isobutyronitrile), and t-butyl perbenzoate. Examples of commercially available thermal initiators include initiators available from DuPont Specialty Chemical (Wilmington, DE) under the VAZO trade designation including VAZO 67 (2,2'-azo-bis(2-methylbutyronitrile)) VAZO 64 (2,2'-azo-bis(isobutyronitrile)) and VAZO 52 (2,2'-azo-bis(2,2-dimethylvaleronitrile)), and LUCIDOL 70 from Elf Atochem North America, Philadelphia, PA.

When more than one initiator is used (e.g., photoinitiator(s) and/or thermal initiator(s)) in a polymerizable composition to form a layer, the resulting layer typically comprises some remaining amount of both a first initiator or initiator fragment and a second initiator or initiator fragment present in the layer.

Unexpectedly, in some embodiments, the attachment of the first layer and the second layer of the article is sufficiently strong to exhibit a peel force of 10 grams per centimeter (g/cm) or greater, 20 g/cm or greater, 30 g/cm or greater, 40 g/cm or greater, 50 g/cm or greater, 60 g/cm or greater, 70 g/cm or greater, 80 g/cm or greater, 90 g/cm or greater, 100 g/cm or greater, 110 g/cm or greater, 120 g/cm or greater, 130 g/cm or greater, 140 g/cm or greater, 150 g/cm or greater, 160 g/cm or greater, 170 g/cm or greater, 180 g/cm or greater, 190 g/cm or greater, or even 200 g/cm or greater; and 500 g/cm or less. In embodiments, at least one the first layer or the second layer themselves fail instead of the two layers separating from each other. By failure of a layer is meant that the layer splits, fractures, fragments, etc., as opposed to maintaining its structural integrity. The peel force (or layer failure) can be determined using the Peel Force test method described in the Examples below.

Figures 3A, 3B:
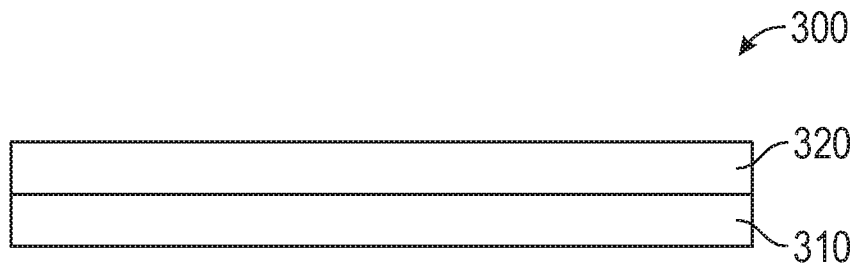
FIG. 3A is a schematic diagram of a cross-section of another exemplary article according to the present application.
FIG. 3B is a schematic diagram of a cross-section of an OLED construction according to Example 1 of the present application.

In a second aspect, an optical information display is provided. The optical information display includes an article according to the first aspect described in detail above. Referring to FIG. 3A, a schematic diagram of a cross-section is provided of an exemplary article 300, in which layer 320 is an article including at least one void, as described in detail with respect to the first aspect above. The layer 310 may represent at least one layer of an optical information display. Some examples of information displays include for instance and without limitation, LCD TVs, computer monitors, cell phone displays, OLED phones or TVs, smart watches, inorganic LED displays, and the like.

In a third aspect, an OLED device is provided. The OLED device includes an article according to the first aspect described in detail above. Organic Light Emitting Diode (OLED) devices include at least a thin film of electroluminescent organic material sandwiched between a cathode and an anode, with one or both of these electrodes being capable of transmitting light. When a voltage is applied across the device, electrons and holes are injected from their respective electrodes and recombine in the electroluminescent organic material through the intermediate formation of excitons.

Once the proper values of the design parameters have been identified, an OLED display panel can be made using conventional OLED fabrication processes which may include depositing organic layers by one or more of vacuum deposition, vacuum thermal evaporation, organic vapor phase deposition, and inkjet printing. Useful methods of manufacturing OLED display panels are described in U.S. Pat. Appl. Publ. Nos. 2010/0055810 (Sung et al.), 2007/0236134 (Ho et al.), 2005/0179373 (Kim) and 2010/0193790 (Yeo et al.).

An OLED display often includes an array of pixels, and each pixel can include several subpixels. Typically, each OLED subpixel emits red, blue or green light. In some cases, subpixels may be used which emit white, cyan, magenta, yellow or other colors of light. OLED subpixels include at least one, and oftentimes several, layers of organic material sandwiched between a cathode and an anode. The design of an OLED subpixel includes selecting the thickness, and optical and electronic properties of each layer so that the emitted light has the desired output. The OLED layer architecture is sometimes referred to as the "emissive stack" or OLED "stack."

Referring to FIG. 3B, a schematic diagram is provided of a cross-section of an OLED construction according to Example 1 below. The article according to the first aspect can be included in combination with the OLED construction, for instance for the purpose of reducing a color shift of the OLED. In certain embodiments, an article containing at least one void can be disposed within an OLED construction. As described in U.S. Provisional Application Nos. 62/342,620 (Freier et al.) and 62/414,127 (Erickson et al.), and in PCT Publication No. WO 2017/205174 (Freier et al.), a color-correction component, such as an optical stack including a nanostructured interface, can be placed proximate an emissive layer of an OLED display panel to reduce the variation in color with view direction without substantially changing the on-axis light output of the display. Other useful color-correction components include partial reflectors which, for example, provide a wavelength dependent reflectivity and transmissivity. Useful partial reflectors are described in U.S. Prov. Appl. Nos. 62/566,654 (Haag et al.) and 62/383,058 (Benoit et al.) and 62/427,450 (Benoit), for example. Other useful color-correction components include polymeric films, which function, for example, as moderate optical diffusers. Useful polymeric films are described in U.S. patent application Ser. No. 15/587,929 (Hao et al.) and Ser. No. 15/587,984 (Hao et al.), for example. In some embodiments, an OLED display includes an encapsulant which may include one or more layers disposed adjacent or proximate the emissive stack. Optionally, the emissive stack may contain one or more layers which are disposed between the cathode and the encapsulant. A circular polarizer may be disposed adjacent the encapsulant. In some cases, a touch sensor may be included in the OLED display. The touch sensor may optionally be included between the encapsulant and the circular polarizer. The article according to the first aspect can be disposed between the encapsulant and the viewer; the article according to the first aspect can optionally be disposed between the encapsulant and the circular polarizer or between the encapsulant and the touch sensor.

In some embodiments, a color-correction component can be placed adjacent a top surface of a top emitting OLED or adjacent a bottom surface of a bottom emitting OLED. For instance, referring again to FIG. 3A, an article layer containing at least one void 320 can be disposed adjacent to an emitting surface of an OLED 310. The OLED may be a strong-cavity OLED or a weak-cavity OLED or a no-cavity OLED. Current OLED markets are dominated by active-matrix organic light-emitting diode (AMOLED) displays, which have a top-emissive architecture and currently do not use any light extraction method except for employing a strong microcavity design. This strong cavity design can have high light efficiency, but the angular color uniformity is much worse than that of liquid crystal displays (LCDs), for example. In some embodiments of the present description, the color-correction component is advantageously used with a strong-cavity OLED, such as an AMOLED, because of the relatively large color shifts typically present in a strong-cavity OLED. In some embodiments, an OLED display includes an encapsulant disposed on emissive layers and a circular polarizer disposed adjacent the encapsulant. In some embodiments, the color-correction component is disposed between the encapsulant and the circular polarizer.

Methods

Various methods may be employed according to the present disclosure to prepare the article according to the first aspect described above. More particularly, in a fourth aspect, a method of making an article is provided. The method comprises:

obtaining a first material comprising a nanostructured first surface comprising nanofeatures and an opposing second surface, wherein the nanostructured first surface comprises recessed features, or protruding features formed of a single composition, or both recessed and protruding features;

contacting a second layer comprising a first major surface with a portion of the nanofeatures, wherein the second layer is an organic layer; and reacting at least one of the first material or the second material to secure the first layer and the second layer together, wherein the nanofeatures of the first layer and the first major surface of the second layer together define at least one void.

Figure 8:
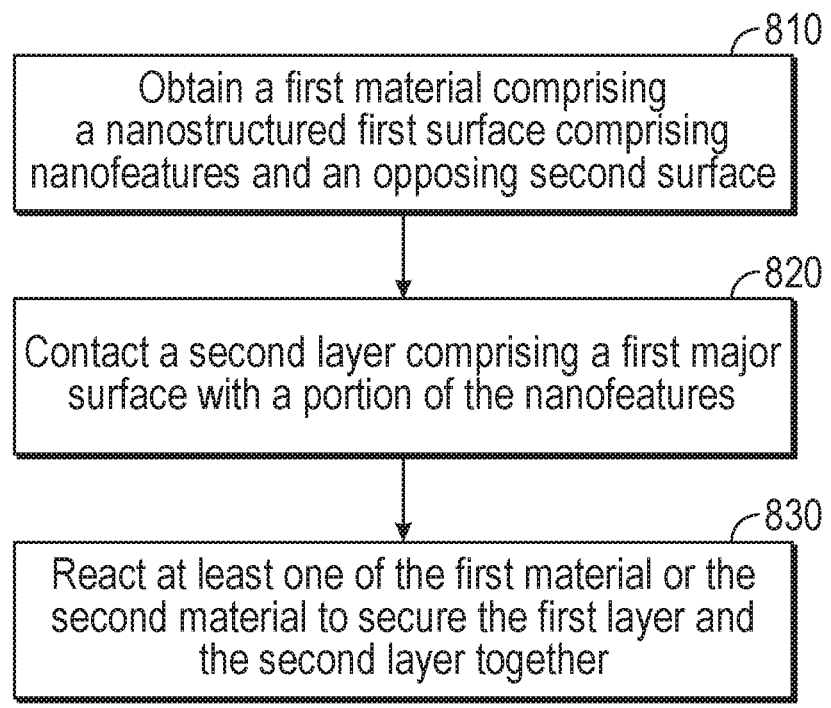
FIG. 8 is a flow chart of an exemplary method of making an article, according to the present application.

FIG. 8 is a flow chart of an exemplary method of making an article, according to the present application. Referring to FIG. 8, a method for making an article includes obtaining a first material comprising a nanostructured first surface comprising nanofeatures and an opposing second surface 810; contacting a second layer comprising a first major surface with a portion of the nanofeatures, wherein the second layer is an organic layer 820; and reacting at least one of the first material or the second material to secure the first layer and the second layer together 830. The nanostructured first surface comprises recessed features and/or protruding features that are formed of a single composition. The nanofeatures of the first layer and the first major surface of the second layer together define at least one void. In any embodiment, the first layer is contacted with the second layer by laminating the first layer and the second layer together. Lamination of layers is well known, and often involves processes such as subjecting at least one outer major surface of a stack of the layers to a weighted roller, or passing stacked layers through a nip roller line or benchtop laminator.

In embodiments including any additional layer (e.g., a third layer, a fourth layer, etc.) attached to a major surface of the first layer or the second layer, the additional layer(s) is preferably attached to one of the first layer or the second layer prior to contacting the first layer with the second layer. For instance, an opposing second surface of the first layer can be attached to a substrate (e.g., a layer) and/or the second layer can have a second major surface that is attached to a substrate (e.g., a layer).

In any embodiment, the first material and/or the second material is reacted by subjecting the first layer and/or the second layer to actinic radiation. Typically, the actinic radiation comprises ultraviolet (UV) light, visible light, e-beam, or any combination thereof. Alternatively, or in addition, the first material and/or the second material is reacted by subjecting the first layer and/or the second layer to heat. An advantage of reacting one or more of the first material or the second material is that the reaction usually creates a stronger connection between the first layer and the second layer than achieved solely by applying physical pressure (e.g., lamination) to the outer major surfaces of the first layer and the second layer, particularly since the major surface of the second layer is typically only in contact with a portion of the nanofeatures instead of in contact with an entire major surface of the first layer. For example, reacting a crosslinkable material may generate crosslinks between the first layer and the second layer. In some embodiments, at least one of the first layer or the second layer comprises a partially cured material and the partially cured material is reacted to secure the first layer and the second layer together. Optionally, the first layer and/or the second layer comprises a photoinitiator, a thermal initiator, or both.

In certain embodiments, the second layer comprises a resin having a solids content of 90% or greater, 92% or greater, 94% or greater, 95% or greater, 96% or greater, 98% or greater, or 99% or greater. Components that are considered "solids" include, for instance and without limitation, polymers, oligomers, monomers, and additives such as initiators and fillers. Typically, only solvents do not fall within the definition of solids, for instance water or organic solvents. In preferred embodiments, the second layer contains less than 5 weight percent of total solvent content, more preferably less than 1 weight percent of total solvent content. In some embodiments, the polymeric material is solvent-free other than any residual solvent (e.g., less than 0.5 weight percent of the second layer).

Figure 10:
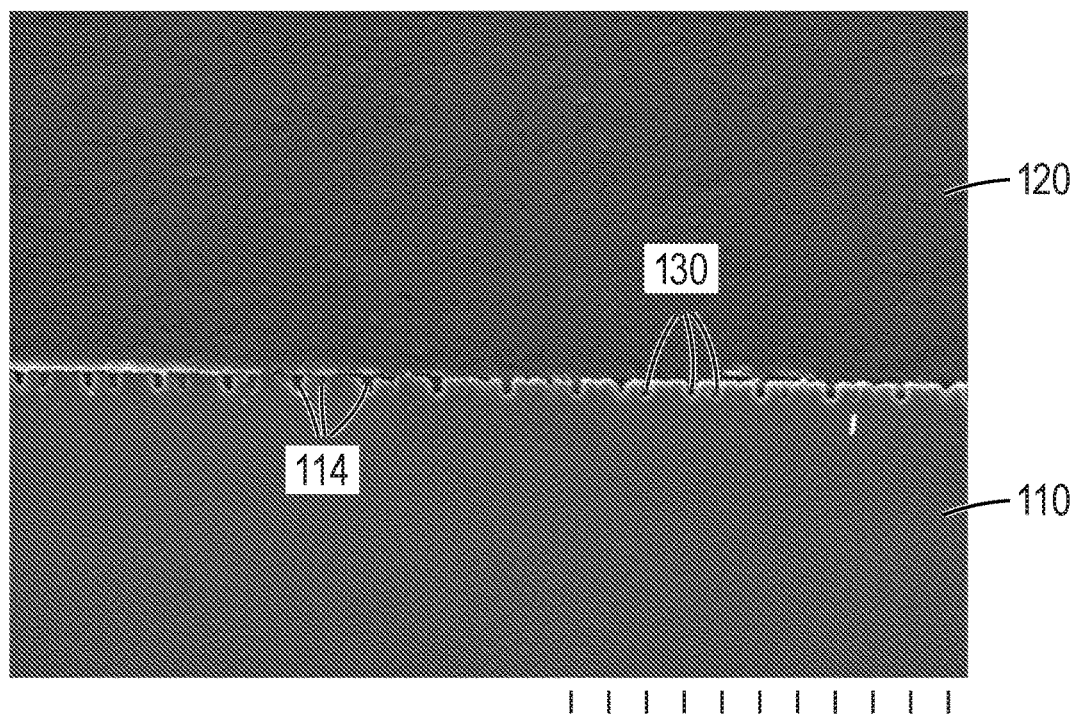
FIG. 10 is an SEM image of a cross-section of a portion of the exemplary article of Example 12, according to the present application.

In embodiments where the first material is an inorganic material, the method comprises reacting the second material to secure the first layer and the second layer together. The second material may be reacted with a functionalized inorganic material. For instance, the inorganic material of the first layer may be functionalized with a coupling agent, in particular with the nanostructured first surface of the first layer. Such a method comprises contacting the first major surface of the second layer with at least a portion of the functionalized nanofeatures, and reacting the second material with functional groups of the coupling agent to secure the first layer and the second layer together. FIG. 10 is an SEM image showing a cross-section of a portion of the exemplary article 1000 of Example 12 below, in which the material of the first layer 110 is silica. The first layer 110 comprises recessed nanofeatures 114 and the second layer 120 are attached together, defining a plurality of voids 130 between the nanostructured surface of the first layer 110 and the first major surface of the second layer 120. The reaction of the second material with the coupling agent provides a reaction product of the coupling agent with the second layer.

Suitable coupling agents include for instance and without limitation, functional silanes with alkoxy or chlorinated groups bonded to silicon atoms, with (meth)acrylic silane coupling agents being particularly useful. Suitable materials may include functional groups that bond with (meth)acrylate coatings, including (meth)acrylate, vinyl, amine, urethane, urea, and thiol functional groups. Included are acrylic silane coupling agent 2-Propenoic acid, 9,9-dimethoxy-4-oxo-3, 10-dioxa-5-aza-9-silaundec-1-yl ester (CAS number 121564-73-6), and others given in U.S. Pat. No. 7,799,888 (Arkles et al.); U.S. Pat. No. 9,029,586 (Arkles et al.); U.S. Pat. No. 9,254,506 (Roehrig et al.); U.S. Pat. No. 9,790,396 (Klun et al.); U.S. Pat. No. 9,982,160 (Klun et al.); U.S. Pat. No. 10,011,735 (Klun et al.), and U.S. Patent Application Publication Nos. 2015/0203707 (Klun et al.) and 2015/0218294 (Klun et al.). Additionally, suitable coupling agents having phosphonic acid groups include those given in U.S. Patent Application Publication No. 2020/0017623 (Ye et al.) and International Application Publication No. WO 2020/046654 (Lin et al.).

Select Embodiments of the Disclosure

Embodiment 1 is an article. The article includes a first layer including a nanostructured first surface including nanofeatures and an opposing second surface; and a second layer including a first major surface attached to a portion of the nanofeatures. The nanostructured first surface includes recessed features, or protruding features formed of a single composition, or both recessed and protruding features. The second layer is an organic layer. The nanofeatures of the first layer and the first major surface of the second layer together define at least one void.

Embodiment 2 is the article of embodiment 1, wherein the second layer is substantially planar.

Embodiment 3 is the article of embodiment 1 or embodiment 2, wherein the at least one void contains a gas.

Embodiment 4 is the article of any of embodiments 1 to 3, wherein the first layer is an organic layer.

Embodiment 5 is the article of any of embodiments 1 to 4, wherein the first layer includes a polymeric material.

Embodiment 6 is the article of any of embodiments 1 to 5, wherein the second layer includes a polymeric material.

Embodiment 7 is the article of any of embodiments 1 to 6, wherein the first layer and the second layer include the same material.

Embodiment 8 is the article of any of embodiments 1 to 7, wherein the first layer, the second layer, or both include a crosslinked material or a crosslinkable material.

Embodiment 9 is the article of any of embodiments 1 to 8, wherein the first layer, the second layer, or both include an acrylic polymer or copolymer.

Embodiment 10 is the article of any of embodiments 1 to 9, wherein the height of the nanofeatures is less than a micrometer.

Embodiment 11 is the article of any of embodiments 1 to 10, wherein the width of the nanofeatures is less than a micrometer.

Embodiment 12 is the article of any of embodiments 1 to 11, wherein the nanofeatures include at least one non-linear surface in at least one direction.

Embodiment 13 is the article of any of embodiments 1 to 12, wherein the nanostructured first surface includes recessed features.

Embodiment 14 is the article of any of embodiments 1 to 13, wherein the nanostructured first surface includes only recessed features.

Embodiment 15 is the article of any of embodiments 1 to 13, wherein the nanostructured first surface includes protruding features.

Embodiment 16 is the article of any of embodiments 1 to 12, wherein the nanostructured first surface includes only protruding features.

Embodiment 17 is the article of any of embodiments 1 to 16, exhibiting a peel force of 10 grams per centimeter (g/cm) or greater, 50 g/cm or greater, 100 g/cm or greater, or 200 g/cm or greater, or exhibits failure of the first layer or the second layer, as determined by the Peel Force test.

Embodiment 18 is the article of any of embodiments 1 to 17, wherein the second layer has an average thickness of greater than 50 nanometers, 100 nanometers, 500 nanometers, 1 micrometer, 2 micrometers, or 3 micrometers.

Embodiment 19 is the article of any of embodiments 1 to 18, further including a third layer attached to the opposing second surface of the first layer.

Embodiment 20 is the article of embodiment 19, wherein the third layer includes a polymeric layer.

Embodiment 21 is the article of embodiment 19 or embodiment 20, wherein the third layer includes a low-birefringent layer.

Embodiment 22 is the article of any of embodiments 1 to 21, further including a fourth layer attached to a second major surface of the second layer.

Embodiment 23 is the article of embodiment 22, wherein the fourth layer includes a polymeric layer.

Embodiment 24 is the article of embodiment 22 or embodiment 23, wherein the fourth layer includes a low-birefringent layer.

Embodiment 25 is the article of any of embodiments 1 to 24, wherein the second layer is nonporous.

Embodiment 26 is the article of any of embodiments 1 to 25, further including a first initiator or initiator fragment and a second initiator or initiator fragment.

Embodiment 27 is the article of any of embodiments 1 to 3, 6, or 8 to 26, wherein the first layer is an inorganic layer.

Embodiment 28 is the article of embodiment 27, wherein the first layer includes an oxide, a nitride, a carbide, or a boride of a metal or a nonmetal, or combinations thereof.

Embodiment 29 is the article of embodiment 27 or embodiment 28, wherein the first layer includes silica.

Embodiment 30 is an optical element including the article of any of embodiments 27 to 29.

Embodiment 31 is an optical information display including the article of any of embodiments 1 to 26.

Embodiment 32 is an OLED device including the article of any of embodiments 1 to 26.

Embodiment 33 is a method of making an article. The method includes obtaining a first material including a nanostructured first surface including nanofeatures and an opposing second surface and contacting a second layer including a first major surface with a portion of the nanofeatures. The method further includes reacting at least one of the first material or the second material to secure the first layer and the second layer together. The nanostructured first surface includes recessed features, or protruding features formed of a single composition, or both recessed and protruding features. The second layer is an organic layer, and the nanofeatures of the first layer and the first major surface of the second layer together define at least one void.

Embodiment 34 is the method of embodiment 33, wherein the reacting includes subjecting the first layer, the second layer, or both, to actinic radiation.

Embodiment 35 is the method of embodiment 34, wherein the actinic radiation includes ultraviolet (UV) light, visible light, e-beam, or a combination thereof.

Embodiment 36 is the method of any of embodiments 33 to 35, wherein the reacting includes subjecting the first layer, the second layer, or both, to heat.

Embodiment 37 is the method of any of embodiments 33 to 36, wherein the second layer includes at least a 90% solids resin.

Embodiment 38 is the method of any of embodiments 33 to 37, wherein the first layer, the second layer, or both, includes a partially cured material and the partially cured material is reacted to secure the first layer and the second layer together.

Embodiment 39 is the method of any of embodiments 33 to 38, wherein the first layer, the second layer, or both include a photoinitiator, a thermal initiator, or both.

Embodiment 40 is the method of any of embodiments 33 to 39, wherein the opposing second surface of the first layer is attached to a substrate.

Embodiment 41 is the method of any of embodiments 33 to 40, wherein the second layer includes a second major surface that is attached to a substrate.

Embodiment 42 is the method of any of embodiments 33 to 41, wherein the contacting includes laminating the second layer and the first layer together.

Embodiment 43 is the method of any of embodiments 33 to 42, wherein the second layer includes an adhesive.

Embodiment 44 is the method of any of embodiments 33 to 43, wherein the first layer includes an inorganic material and the reacting includes reacting the second material to secure the first layer and the second layer together.

Embodiment 45 is the method of embodiment 44, wherein the inorganic material is functionalized with a coupling agent and the second material is reacted with the coupling agent.

EXAMPLES

Advantages and embodiments of this invention are further illustrated by the following examples, but the particular materials and amounts thereof recited in these examples, as well as other conditions and details, should not be construed to unduly limit this invention. Unless otherwise noted or readily apparent from the context, all parts, percentages, ratios, etc. in the Examples and the rest of the specification are by weight.

Materials Used in the Examples

| Description | Trade Designation or Component Name | Source |
| --- | --- | --- |
| Urethane acrylate oligomer | PHOTOMER 6210 | IGM Resins, Charlotte, NC |
| Ethoxylated (4) bisphenol A diacrylate | SR601 | Sartomer Americas, Exton, PA |
| Ethoxylated (10) bisphenol A diacrylate | SR602 | Sartomer Americas, Exton, PA |
| Tetrahydrafurfuryl acrylate | SR285 | Sartomer Americas, Exton, PA |
| 1,6-Hexandiol diacrylate | SR238 | Sartomer Americas, Exton, PA |
| Trimethylolpropane triacrylate | SR351 | Sartomer Americas, Exton, PA |
| Propoxylated (2) neopentyl glycol diacrylate | SR9003 | Sartomer Americas, Exton, PA |
| Ethoxylated trimethylolpropane triacrylate | SR454 | Sartomer Americas, Exton, PA |
| 2-Phenoxyethyl acrylate | ETERMER 210 | Toagosei America Inc., West Jefferson, OH |
| Dicyclohexylmethane-4,4'diisocyanate | HMDI | Covestro LLC, Pittsburgh, PA |
| Polyether glycol | TERATHANE 1000 | Invista, Wichita, KS |
| Dibutyultin dilaurate | SKU 291234 | Sigma-Aldrich Corporation, St. Louis, MO |
| 2-hydroxyethylacrylate | HEA | Kowa American Corporation, New York, NY or Alfa |

-continued

| Materials Used in the Examples | | |
|---|---|---|
| Description | Trade Designation or Component Name | Source |
| Butylated hydroxytoluene | BHT | Aesar, Ward Hill, MA Oxiris Chemicals S.A., Barcelona, Spain |
| Methoxy hydroquinone | MEHQ | Solvay USA Inc., Cranbury NJ |
| Antioxidant | IRGANOX 1035 | BASF, Florham Park, NJ |
| Diphenyl(2,4,6-trimethylbenzoyl)phosphine oxide | IRGACURE TPO | BASF, Florham Park, NJ |
| 2-Hydroxy-2-methyl-1-phenyl-propan-1-one | DAROCUR 1173 | BASF, Florham Park, NJ |
| 2-Propenoic Acid, 4-benzoylphenyl ester, CAT#: 74284 | ABP | Astatech, Bristol, PA |
| 2-Propenoic Acid, 2-(4-benzoylphenoxy) ethyl ester | AEBP | Prepared as described in Example B (column 11, lines 5-37) of U.S. Pat. No. 4,847,137 (Kellen, et al.) |
| Terpolymer of isooctyl acrylate (50 weight %), ethyl acrylate (40 weight %), and acrylic acid (10 weight %) having an intrinsic viscosity of 1.9. | Polyacrylate PSA | Prepared in-house |
| Diethyl phthalate | DEP | Thirumalai Chemicals Ltd., Mumbai, India |
| Toluene | Toluene | Sigma-Aldrich Corporation, St. Louis, MO |
| Methanol | Methanol | Sigma-Aldrich Corporation, St. Louis, MO |
| Ethyl Acetate | Ethyl Acetate | Sigma-Aldrich Corporation, St. Louis, MO |
| (4-octyloxyphenyl) phenyliodonium hexafluoroantimonate | OPPI SbF6 | Hampford Research Inc. Stratford, CT |
| (3-4-epoxycyclohexane) methyl 3'-4'-epoxycyclohexyl-carboxylate | CELLOXIDE 2021P | Diacel USA, Fort Lee, NJ |
| Isopropyl thioxanthone (2 and 4 isomer mixture) | ADDITOL ITX | Cytec Industries, Woodland Park, NJ |
| Linear butylene ethylene styrene (B-E-S) triblock copolymer | KRATON G1645 | Kraton Corporation, Houston, TX |
| Polypropylene random copolymer | PP9074MED | ExxonMobil Corporation, Irving TX |
| PETG Copolyester | EASTAR GN071 | Eastman Chemical Company, Kingsport, TN |
| Acrylic polymer binder thought to be a combination of acrylic latex and melamine/formaldehyde curing resin with triethylamine added | RHOPLEX 3208 | Dow Chemical Co., Midland, MI |
| ![structure] | K-90 | Preparative Example 7 of U.S. Pat. No. 9,790,396 |
| 2-Propanol | 2-Propanol | Sigma-Aldrich Corporation, St. Louis, MO |
| Colloidal silica nanoparticles, nominally 16 weight percent, 5 nm particle size | NALCO 2326 | Nalco Company, Naperville, IL |
| 3-(methacryloyloxy)propyltrimethoxysilane | 3-(methacryloyloxy)-propyltrimethoxysilane | Alfa Aesar, Ward Hill, MA |

Materials Used in the Examples

| Description | Trade Designation or Component Name | Source |
| --- | --- | --- |
| Diethylene glycol monoethyl ether | Diethylene glycol monoethyl ether | Alfa Aesar, Ward Hill, MA |
| 1-Methoxy-2-propanol | 1-Methoxy-2-propanol | Aldrich Chemical Company, Milwaukee, WI |
| 4-Hydroxy-TEMPO | 4-Hydroxy-TEMPO | Aldrich Chemical Company, Milwaukee, WI |
| UV/Visible photoinitiator | OMNIRAD 819 | IGM Resins, Waalwijk, The Netherlands |
| Octyl acrylate | Octyl acrylate | Prepared as described in Example 4 of U.S. Pat. No. 9,908,837 |
| Trimethylolpropane triacrylate | SR351 H | Sartomer USA, Exton, PA |
| Hexafunctional urethane acrylate | CN975 | Sartomer USA, Exton, PA |

Test Methods

Peel Force

Peel force was evaluated by performing a 180 degree peel test using a Slip/Peel Tester (obtained under the trade designation "IMASS SP-2100" from iMass, Inc, Accord, MA). Test samples were cut into 2.54 cm wide strips. A test sample was mounted to the platen of the SP-2100 by attaching one side of the laminate to the platen with 1 inch (2.54 cm) wide double-sided tape (obtained under the trade designation "3M REPOSITIONABLE TAPE 665" from 3M Co., St. Paul, MN). The laminate was separated at the desired interface and the portion of the laminate opposite the platen was attached to the iMass load cell. The platen was advanced at 0.508 cm/s and the force was recorded for 10 s. The average peel force over that time was reported.

Color Correction

The color-shift reduction for a blue strong-cavity OLED was tested as follows. The OLED layer structure is summarized in FIG. 3B. Briefly, the layer structure was fabricated at the following layer thicknesses in the following order: a 15 nm layer of indium tin oxide (ITO), an approximately 100 nm hole transport layer (HTL), a 10 nm electron blocking layer (EBL), a 20 nm emissive layer consisting of 90% blue host material and 10% blue dopant material, a 50 nm electron transport layer, a 1.5 nm layer of LiF, an 8 nm layer of 10% Ag and 90% Mg, and a 65 nm capping layer consisting of the hole transport layer. All layers were deposited via vacuum thermal evaporation. A thin film encapsulation was then applied, consisting of a 46 nm layer of $Al_2O_3$, a 2 micron layer of UV-curable organic monomer (obtained under the trade designation "E-200" from EM Index Company, Daejeon, Korea) and a second 46 nm layer of $Al_2O_3$. OLED devices were fabricated with a range of HTL thicknesses; each OLED device exhibited a unique current efficiency (cd/A) and color shift. Color shift can be calculated from the CIE 1976 color coordinates (u', v'); the magnitude of color shift is given by:

$$\Delta u'v' = SQRT((u'_i - u'_o)^2 + (v'_i - v'_o)^2)) \text{ where}$$

($u'_o$, $v'_o$) is the color coordinate of the OLED emission at normal viewing angle and (u'–v') is the color coordinate at the $i^{th}$ viewing angle Color correction is defined as the reduction in color-shift between the reference OLED device and the same OLED device with the film applied. A just-noticeable-difference (JND) can be defined as a vector of length 0.005 in CIE 1976 colorspace.

Brightness and color were measured for each OLED device at normal incidence and 45 degrees from normal incidence using a calibrated spectrophotometer (obtained under the trade designation "SPECTRASCAN PR-655" from Photo Research, Inc., North Syracuse, NY). The OLED device was attached to a rotation mount which allowed the device to be repeatedly positioned at normal incidence and 45 degrees from normal incidence. Afterwards, the nanostructured film was applied to each OLED device using an index matching gel (n=1.46). Each OLED device was re-measured in an identical manner.

Preparatory Examples

A polyurethane acrylate mixture was prepared by first adding 540 g HMDI to 1000 g TERATHANE 1000 with 0.38 g dibutyultin dilaurate as a catalyst. This isocyanate-terminated prepolymer was further reacted with 239.4 g HEA (from Kowa) in the presence of 1.4 g BHT and 0.1 g MEHQ. The reaction was considered complete when an isocyanate peak was no longer present at around 2275 $cm^{-1}$ by Fourier-transform infrared spectroscopy. The resulting polyurethane acrylate was then diluted with 1021 g of SR454.

Unless noted otherwise, after all components were added, the mixtures were blended by warming to approximately 50° C. and mixing for 12 hours on a roller mixer. Mixtures were blended until they appeared homogeneous.

The polyurethane acrylate mixture, SR602, SR601, SR351, and ETERMER 210 were combined and mixed in weight ratios of 60/20/4/8/8 to produce Resin A.

Resin B was prepared by combining and mixing IRGACURE TPO, DAROCUR 1173 and IRGANOX 1035 in respective weight ratios of 0.35/0.1/0.2 parts per 100 parts of Resin A.

Resin C was prepared by combining and mixing 0.5 parts by weight of ABP to 99.5 parts by weight Resin B.

Resin D was prepared by combining and mixing 0.5 parts by weight of AEBP to 99.5 parts by weight Resin B.

Resin E was prepared by combining and mixing 2 parts by weight of AEBP to 98 parts by weight Resin B.

Resin F was prepared by combining and mixing IRGANOX 1035, IRGACURE TPO, DAROCUR 1173 and SR285 in weight ratios of 3.17/1.59/5.56/89.68.

Resin G was prepared by combining and mixing PHOTOMER 6210, SR 9003 and Resin F in weight ratios of 22.5/25/2.825.

Resin H was prepared by combining and mixing 2 parts by weight of AEBP to 98 parts by weight Resin G.

Resin I was prepared by combining and mixing the components listed in Table 1 in the amounts shown.

TABLE 1.

| Component | Amount (grams) |
| --- | --- |
| Polyacrylate PSA | 1390.36 |
| DEP | 22.65 |
| Toluene | 590.8 |
| Methanol | 422.98 |
| Ethyl Acetate | 1635.96 |
| OPPI SbF6 | 19.10 |
| ADDITOL ITX | 0.55 |

Resin J was prepared by combining and mixing 80.88 grams of ethyl acetate with 129.42 grams of CELLOXIDE 2021P.

Resin K was prepared by combining and mixing all of Resin I with all of Resin J.

Resin L was prepared by combining and mixing 30 parts by weight of Resin K with 70 parts by weight of a solvent blend consisting of 88 parts by weight ethyl acetate, 5 parts by weight methanol, and 7 parts by weight toluene.

Resins I, J, K, and L were each prepared by mixing at room temperature until homogeneous.

Resin M was prepared by combining and mixing PHOTOMER 6210, SR238, SR351 and IRGACURE TPO in weight ratios of 60/20/20/0.5.

Mixture A was prepared by mixing 0.103 g DAROCUR 1173 with 9.97 g of 2-propanol.

Mixture B was prepared by mixing 0.019 g K-90, 0.062 g Mixture A and 18.94 g of 2-propanol.

Film A was prepared by first preparing a multilayer film using the method described in PCT Publ. No. WO 2019/032635 A1 (Johnson, et al.). The resulting multilayer film had a 43 micron polyethylene terephthalate (PET) layer, a 6 to 7 micron linear B-E-S triblock copolymer layer ("KRATON G1645"), a 6 to 7 micron layer comprising a blend of 60 parts by weight polypropylene random copolymer ("PP9074MED") and 40 parts by weight B-E-S triblock copolymer ("KRATON G1645") and a 15 micron PETG copolyester layer ("EASTAR GN071"). Resin C was die coated from a heated storage container, through a heated hose and a heated die, all set to 65.5° C., onto the copolyester surface of the multilayer film. The coated side of the film was pressed against a nanostructured nickel surface attached to a steel roller controlled at 71° C., using a rubber-covered roller, at a speed of 7.6 meters per minute (m/min). The coating thickness of Resin C on the film was sufficient to fully wet the nickel surface and form a rolling bead of resin as the coated film was pressed against the nanostructured nickel surface. The resin-coated film was exposed to radiation from a UV LED curing system (obtained under the trade designation "FIREJET FJ 300X20AC405-12W", from Phoseon Technologies, Hillsboro, OR) operating at 100% power while in contact with the nanostructured nickel surface. Nanostructured Film A was peeled from the nanostructured nickel surface. The nanostructured surface of Film A was imaged with a scanning electron microscope at 40,000× magnification and the resulting micrograph is shown in FIG. 4.

Film B was prepared by the same procedures as Film A except a smooth chrome surface was used in place of the nanostructured nickel surface, the PETG copolyester layer thickness was 5 microns and the UV LED curing system was operated at 75% power.

Film C was prepared by die coating Resin B from a heated storage container, through a heated hose and heated die, all set to 65.5° C., onto a 125 micron thick polycarbonate film with a gloss surface finish on both sides (obtained under the trade designation "LEXAN" from Tekra, Inc., New Berlin, WI). The coated film was pressed against a nanostructured nickel surface attached to a steel roller controlled at 60° C. using a rubber covered roller at a speed of 15.2 m/min. The coating thickness of Resin B on the film was sufficient to fully wet the nickel surface and form a rolling bead of resin as the coated film was pressed against the nanostructured nickel surface. The film was exposed to radiation from two UV lamp systems (obtained under the trade designation "F600" from Fusion UV Systems, Gaithersburg, MD) fitted with D bulbs operating at 142 W/cm and 236 W/cm, respectively, while in contact with the nanostructured nickel surface. Nanostructured Film C was peeled from the nickel surface. The nanostructured surface of Film C was imaged with a scanning electron microscope at 40,000× magnification and the resulting micrograph is shown in FIG. 5.

Films D-H were prepared using the resin and curing conditions given in Table 2 using the following procedure. The indicated resin was coated between a piece of 50 micron thick biaxially-oriented polyethylene terephthalate (PET) film (prepared in-house) primed with an acrylic polymer ("RHOPLEX 3208") adhesion promoter, and a piece of conventional unprimed 50 micron thick biaxially-oriented PET film (made in house), by placing a bead of indicated resin between the two films and contacting the primed side of the primed film. The PET film/resin/primed PET film construction was supported on a 1.6 mm thick aluminum plate and the construction was passed through a bench top laminator (obtained under the trade designation "Model HL-100" from Cheminstruments, Inc. Fairfield OH) at a speed setting of "2" and a pressure setting of 16 psi (110 kpa). The laminated construction was passed under the listed UV curing system operating at power setting indicated in Table 2 at a speed of 7.6 m/min. Films D-H were prepared, respectively, by removing the untreated PET film leaving the resin layer on the primed PET film.

TABLE 2

| Film | Resin | UV Curing System | UV Curing System Power Setting |
| --- | --- | --- | --- |
| D | G | Fusion ("F600") fitted with H Bulb | 236 W/cm |
| E | G | Phoseon ("FIREJET FJ 300X20AC405-12W") | 60% |
| F | H | Phoseon ("FIREJET FJ 300X20AC405-12W") | 60% |
| G | B | Phoseon ("FIREJET FJ 300X20AC405-12W") | 60% |
| H | E | Phoseon ("FIREJET FJ 300X20AC405-12W") | 60% |

Film I was prepared by die coating Resin D from a heated storage container, through a heated hose and a heated die, all set to 65.5° C., onto the PETG copolyester ("EASTAR GN071") surface of the multilayer film used for Film A. The coated film was pressed against a nanostructured nickel surface, that had the same nanostructure as the nickel surface used to make Film C, attached to a steel roller controlled at 65.6° C., with a rubber covered roller at a speed of 7.6 m/min. The coating thickness of Resin D on the film was sufficient to fully wet the nickel surface and form a rolling bead of resin as the coated film was pressed against the nanostructured nickel surface. The resin coated film was exposed to radiation from a UV LED curing system (obtained under the trade designation "FIREJET FJ 300X20AC385-12W", from Phoseon Technologies, Hillsboro, OR) operating at 50% power. Nanostructured Film I was peeled from the nickel surface.

Film J was prepared by the same procedure as Film I except a smooth chrome surface was used in place of the nanostructured nickel surface, the PETG copolyester ("EASTAR GN071") layer thickness was 5 microns, the polypropylene/triblock copolymer blend layer was a blend of 80 parts by weight polypropylene random copolymer ("PP9074MED") and 20 parts by weight triblock B-E-S copolymer ("KRATON G1645"), Resin H was used in place of Resin D, and the Phoseon lamp ("FIREJET FJ 300X20AC385-12W") was operated at 60% power.

Film K was prepared by die coating Resin B from a heated storage container, through a heated hose and a heated die, all set to 65.5° C., onto a 125 micron thick polycarbonate film ("LEXAN") with a gloss surface finish on both sides. The coated film was pressed against a nanostructured nickel surface attached to a steel roller controlled at 71° C. with a rubber covered roller at a speed of 15.2 m/min. The coating thickness of Resin B on the film was sufficient to fully wet the nickel surface and form a rolling bead of resin as the coated film was pressed against the nanostructured nickel surface. The resin coated film was exposed to radiation from two Fusion UV lamp systems ("F600") each fitted with a D bulb operating at 142 W/cm power while the resin and film were still in contact with the nanostructured nickel surface. The film was then peeled from the nickel surface and the Resin B side of the film was exposed to radiation from a Fusion UV lamp system ("F600") fitted with a D bulb operating at 142 W/cm. A sample of the resulting Film K was fractured while immersed in liquid nitrogen and imaged with a scanning electron microscope at 50,000× magnification and the resulting micrograph is shown in FIG. 6.

Film L was prepared by die coating Resin M at room temperature onto a 75 micron thick biaxially-oriented polyethylene terephthalate (PET) film (prepared in-house) primed with an acrylic polymer ("RHOPLEX 3208") adhesion promoter. The coated film was pressed against a nanostructured nickel surface attached to a steel roller controlled at 49° C. using a rubber covered roller at a speed of 9.1 m/min. The coating thickness of Resin M on the film was sufficient to fully wet the nickel surface and form a rolling bead of resin as the coated film was pressed against the nanostructured nickel surface. The film was exposed to radiation from two UV lamp systems (obtained under the trade designation "F600" from Fusion UV Systems, Gaithersburg, MD) both fitted with D bulbs and dichroic reflectors and operating at 236 W/cm while in contact with the nanostructured nickel surface. Nanostructured Film L was peeled from the nickel surface.

Film M was prepared by attaching the leading edge of two pieces of unprimed 75 micron thick biaxially-oriented polyethylene terephthalate (PET) film (prepared in-house) onto a 1.6 mm thick aluminum plate. The films and plate were placed into a 60° C. oven for 1 minute. Resin B was heated in a 60° C. oven and a bead of the heated Resin B was placed between the two films. The PET film/Resin B/PET film/ aluminum plate construction was passed through a bench top laminator (obtained under the trade designation "Model HL-100" from Cheminstruments, Inc. Fairfield OH) at a speed setting of "1", top and bottom roller temperatures set to 60° C., and a pressure setting of 15 psi (103 kpa). The PET film/Resin B/PET film/aluminum plate construction was exposed to radiation from a UV LED curing system (obtained under the trade designation "FIREJET FJ 300X20AC405-12W", from Phoseon Technologies, Hillsboro, OR) operating at 25% power at a speed of 15.2 m/min. Film M was removed from the aluminum plate.

Structured Sample A was prepared using the following procedure. A concentrated sol of surface-modified silica nanoparticles (Nalco 2326 modified with 3-(methacryloyloxy)propyltrimethoxysilane) in diethylene glycol monoethyl ether was prepared as described in Example 1 of U.S. Patent Application Publication No. US 2019/0185328 (Humpal et al.). The resulting sol contained 45.60 weight percent oxide. To prepare the casting sol, a portion of the concentrated sol (200.14 grams) was charged to a 500-mL bottle and combined with diethylene glycol monoethyl ether (1.48 grams), HEA (2.83 grams, from Alfa Aesar), octyl acrylate (5.68 grams), trimethylolpropane triacrylate (SR351 H) (50.00 grams), and a hexafunctional urethane acrylate (CN975) (24.95 grams). OMNIRAD 819 (6.84 grams) was dissolved in diethylene glycol monoethyl ether (174.14 grams) and added to the bottle. The sol was passed through a 1-micron filter. The casting sol contained 19.58 weight percent oxide and 56.41 weight percent solvent. The casting sol was charged to an acrylic mold cavity (dimensions: 30 mm×30 mm×3 mm). The structured side of Nanostructured Film L formed one face of the mold cavity. The walls of the mold cavity were treated with a release coating. Once the cavity was filled, the casting sol was cured (polymerized) for 30 seconds using a LED array positioned 40 mm away from the surface of the mold. The diodes, with a wavelength of 450 nm, were spaced 8 mm apart in a 10×10 array. The resulting shaped gel replicated the features of the structured film tool, felt dry, and was robust to handling when removed from the mold. The shaped gel was then dried using supercritical $CO_2$ extraction in a manner similar to that described the Examples section of U.S. Patent Application Publication No. US 2019/0185328 (Humpal et al.). The shaped aerogel was crack-free after drying. This shaped aerogel was placed on 3-mm diameter quartz rod on 1-mm thick alumina plate and heated in air according to the following to remove organic components and densify, according to the heating schedules described in the Examples section of U.S. Patent Application Publication No. US 2019/0185328 (Humpal et al.) except for minor changes to the times and temperatures. The resulting Structured Sample A was crack-free, transparent and replicated the mold features precisely.

Structured Sample A was placed in an ozone cleaner (obtained under the trade designation UVO Cleaner Model 144AX from Jelight Company, Irvine CA). A drop of Mixture B was then placed onto the structured surface of Structured Sample A using a disposable pipet. Mixture B was then spread over the structured surface using a #7 wire wound coating rod (obtained under trade designation RDS07 from R.D. Specialties, Inc., Webster NY). The coated Structured Sample A was allowed to dry at room temperature and then placed into a 75° C. oven for 60 minutes resulting in Structured Sample B. A scanning electron microscope image at 10,000× of the structured surface of a second sample prepared using the same procedure as Structured Sample B is shown in FIG. 9.

EXAMPLES

Example 1

Example 1 was prepared by pressing the nanostructured surface of Film A to the Resin C coated surface of Film B between a smooth chrome roller and a rubber covered roller at a speed of 6.1 m/min. The Film A side of the construction was exposed to energy from a Fusion UV lamp system ("F600") fitted with a D bulb operating at 236 W/cm while the construction was still in contact with the smooth chrome roller. The Film B side of the construction was exposed to energy from a Fusion UV lamp system ("F600") fitted with a D bulb operating at 141 W/cm after removing the construction from the smooth chrome roller. The film construction of Example 1 was cross-sectioned using a broad beam ion mill (obtained under the trade designation GATAN ILION III from Gatan, Inc. Pleasanton, California) by mounting the sample to a blade mount using silver paint and an 80 micron overhang about the blade edge and subjecting the sample to an argon ion beam while under vacuum. The sample was inserted into the ion mill and cooled to −162° C., then milled for 3 hours and 30 minutes at 5 KV while rotating at 1 rpm. The voided nanostructured area of the Example 1 cross-section was imaged with a scanning electron microscope at 50,000× magnification and the resulting micrograph is shown in FIG. 7.

Color correction of Example 1 was measured on 3 different OLED devices fabricated with differing HTL thicknesses. The results are reported in Table 3.

TABLE 3

| Film | Initial Blue Color-Shift | Blue Color-Shift with Film | Color Correction | Color Correction (JND) |
|---|---|---|---|---|
| Example 1 | 0.020 | 0.011 | 0.009 | 1.8 |
| Example 1 | 0.031 | 0.025 | 0.006 | 1.2 |
| Example 1 | 0.046 | 0.039 | 0.007 | 1.4 |

Examples 2-6

Example 2 was prepared by laminating the resin coated surface of Film D to the nanostructured surface of Film C using the following procedure. The leading edge of Film C and Film D were taped onto a 1.6 mm thick aluminum plate and passed through a bench top laminator ("HL-100") at a speed setting of "2" and a pressure of 16 psi (110 kps). The laminated construction was passed under the UV light from a Fusion UV lamp system ("F600") fitted with an H bulb operating at 236 W/cm. Examples 3 through 6 were prepared in the same way by substituting the film indicated in Table 4 for Film D.

The Peel Force of each of Examples 2 through 6 was measured by attaching the Film C side of the construction to the platen and attaching Films D through H, respectively, to the load cell. The resulting peel force measurements are reported in Table 4.

TABLE 4

| Example | Film | Peel Force, g/cm |
|---|---|---|
| 2 | D | 50 |
| 3 | E | 80 |
| 4 | F | 280 |
| 5 | G | 450 |
| 6 | H | 410 |

Example 7

Example 7 was prepared by pressing the nanostructured surface of Film I to the Resin H coated surface of Film J between a smooth chrome roller and a rubber covered roller at a speed of 3.05 m/min. The Film I side of the construction was exposed to energy from two Fusion UV lamp systems ("F600") each fitted with a D bulb and operating at 236 W/cm while the construction was still in contact with the smooth chrome roller. The Film J side of construction was exposed to energy from a Fusion UV lamp system ("F600") fitted with a D bulb operating at 141 W/cm after removing the construction from the smooth chrome roller. Example 7 was fractured while immersed in liquid nitrogen. The fractured edge of Example 7 was imaged with a scanning electron microscope at 1000×, 20,000× and 50,000× magnification and the resulting micrographs are shown in FIGS. 2A, 2B, and 2C, respectively.

Example 8

Example 8 was prepared by laminating the resin coated surface of Film B to the nanostructured surface of Film K using the following procedure. The leading edge of Film K and Film B were taped onto a 1.6 mm thick aluminum plate and passed through a bench top laminator ("HL-100") at a speed setting of "2" and a pressure of 16 psi (110 kpa). The laminated construction was passed under the UV light from a Fusion UV lamp system ("F600") fitted with a D-bulb operating at 236 W/cm. The nanostructure was visible in the resulting Example 8.

Example 9

A cured layer of Resin B was prepared by coating Resin B at about 250 microns thick between 2 sheets of unprimed conventional biaxially-oriented PET film (made in house), twice passing the film-resin construction under a Fusion UV lamp system ("F600") fitted with a D bulb, operating at 236 W/cm, at 10.7 m/min, then removing the two sheets of PET film to obtain a sheet of cured Resin B. The cured Resin B sheet was laminated to a portion of the nanostructured surface of Film C with a hand roller. The resulting construction was exposed to E-beam radiation at 16 mRad and 280 keV with an electron beam processor (obtained under the trade designation "PCT BROADBEAM" from PCT Ebeam and Integration, LLC, Davenport, IA). The visibility of the nanostructured pattern faded some where the resin B layer covered it, but the pattern was still visible a day later.

Example 10

Example 10 was prepared as Example 9 but without E-beam exposure. The adhesion of the Resin B layer to the Film C layer for Example 10 was qualitatively less than Example 9 when peeled by hand.

Example 11

A 50 micron thick biaxially-oriented PET film (made in-house) was coated with Resin L. A Resin L solution was applied to a moving web at 5 feet per minute (1.52 meters per minute) using a slot die fed by a syringe pump. The coating was dried on the web using a hot-plate at 200° F. (93° C.) to yield a final coating thickness of 25 nm. Film C was laminated to the Resin K coated film by passing the films between two rubber covered rollers pressed together at 13.6 kg of force. The resin was then cured using ultra-violet light. The presence of nanostructure is evidenced by the iridescence of the sample. The peel force of Example 11 was measured at 3 g/cm.

Example 12

Example 12 was prepared by first removing one layer of the PET film from Film M and then laminating the exposed Resin B side of Film M to the nanostructured surface of Structured Sample B with a hand roller. The PET/Resin B side of the laminated construction was exposed to radiation from a UV lamp system (obtained under the trade designation "F600" from Fusion UV Systems, Gaithersburg, MD) fitted with a D bulb and a dichroic reflector operating at 236 W/cm at a speed of 15.2 m/min. The remaining PET film was removed from the construction. The resulting Example was cross-sectioned by applying a piece of tape to the unstructured side of Structured Sample B of Example 12, grasping the Example with two pair of glass pliers and flexing the Example. The resulting cross-section of Example 12 was imaged with a scanning electron microscope and the resulting micrograph at 10,000× magnification is shown in FIG. 10.

Comparative Example

Comparative Example 1

Comparative Example 1 was prepared as Example 11 except Resin L was coated at a flow rate selected to obtain a final coating thickness of 150 nm before lamination. Comparative Example 1 was transparent and not iridescent, indicating very little or no air adjacent to the nanostructured surface.

All of the patents and patent applications mentioned above are hereby expressly incorporated by reference. In the event that any inconsistency exists between the disclosure of the present application and the disclosure(s) of any document incorporated herein by reference, the disclosure of the present application shall govern. The embodiments described above are illustrative of the present invention and other constructions are also possible. Accordingly, the present invention should not be deemed limited to the embodiments described in detail above and shown in the accompanying drawings, but instead only by a fair scope of the claims that follow along with their equivalents.

The invention claimed is:

1. An article comprising:
    a first layer comprising a nanostructured first surface comprising nanofeatures and an opposing second surface, wherein the nanostructured first surface comprises recessed features, or protruding features formed of a single composition, or both recessed and protruding features; and
    a second layer comprising a first major surface attached to a portion of the nanofeatures, wherein the second layer is an organic layer,
    wherein either 1) the first layer comprises an inorganic material and a reaction product of a coupling agent is between the first layer and the second layer or 2) the first layer comprises an organic material and comprises crosslinks between the first layer and the second layer,
    wherein the nanofeatures of the first layer and the first major surface of the second layer together define at least one void.

2. The article of claim 1, wherein the second layer is substantially planar.

3. The article of claim 1, wherein the at least one void contains a gas.

4. The article of claim 1, wherein the first layer comprises a polymeric material.

5. The article of claim 1, further including a first initiator or initiator fragment and a second initiator or initiator fragment.

6. The article of claim 1, wherein the first layer, the second layer, or both comprise an acrylic polymer or copolymer.

7. The article of claim 1, further comprising a third layer attached to the opposing second surface of the first layer.

8. The article of claim 7, wherein the third layer comprises a low-birefringent layer.

9. The article of claim 1, wherein the second layer is nonporous.

10. The article of claim 1, exhibiting a peel force of 50 grams per centimeter (g/cm) or greater, or exhibits failure of the first layer or the second layer.

11. The article of claim 1, wherein the first layer is an inorganic layer.

12. The article of claim 11, wherein the first layer comprises silica.

13. An optical information display comprising the article of claim 1.

14. An OLED device comprising the article of claim 1.

15. A method of making an article, the method comprising:
    obtaining a first material comprising a nanostructured first surface comprising nanofeatures and an opposing second surface, wherein the nanostructured first surface comprises recessed features, or protruding features formed of a single composition, or both recessed and protruding features;
    contacting a second layer comprising a first major surface with a portion of the nanofeatures, wherein the second layer is an organic layer; and
    reacting at least one of the first material or the second material either to generate crosslinks between the first layer and the second layer or to form a reaction product of a coupling agent between the first layer and the second layer to secure the first layer and the second layer together,
    wherein the nanofeatures of the first layer and the first major surface of the second layer together define at least one void.

16. The method of claim 15, wherein the reacting comprises subjecting the first layer, the second layer, or both, to actinic radiation.

17. The method of claim 15, wherein the reacting comprises subjecting the first layer, the second layer, or both, to heat.

18. The method of claim 15, wherein the second layer comprises at least a 90% solids resin.

19. The method of claim 15, wherein the first layer comprises an inorganic material and the reacting comprises reacting the second material to secure the first layer and the second layer together.

20. The method of claim 19, wherein the inorganic material is functionalized with a coupling agent and the second material is reacted with the coupling agent.

* * * * *